US008933557B2

(12) United States Patent
Gohara et al.

(10) Patent No.: US 8,933,557 B2
(45) Date of Patent: Jan. 13, 2015

(54) SEMICONDUCTOR MODULE AND COOLING UNIT

(75) Inventors: Hiromichi Gohara, Matsumoto (JP); Akira Morozumi, Okaya (JP); Keiichi Higuchi, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/382,621

(22) PCT Filed: Jul. 28, 2010

(86) PCT No.: PCT/JP2010/004791

§ 371 (c)(1),
(2), (4) Date: Feb. 13, 2012

(87) PCT Pub. No.: WO2011/018882

PCT Pub. Date: Feb. 17, 2011

(65) Prior Publication Data

US 2012/0139096 A1 Jun. 7, 2012

(30) Foreign Application Priority Data

Aug. 10, 2009 (JP) ................................. 2009-185722

(51) Int. Cl.
*H01L 23/36* (2006.01)
*H01L 23/473* (2006.01)
*H01L 23/373* (2006.01)

(52) U.S. Cl.
CPC .......... *H01L 23/473* (2013.01); *H01L 23/3735* (2013.01); *H01L 2224/32225* (2013.01)
USPC ................... 257/706; 257/E23.101; 257/712; 257/713; 257/717; 257/720; 257/718; 257/719; 257/722; 257/715; 257/704; 361/699; 361/715; 165/168; 165/185

(58) Field of Classification Search
USPC ......... 257/706, 712, 713, 717, 720, 718, 719, 257/722, 715, 704, E23.101; 361/699, 715; 165/168, 185
See application file for complete search history.

(56) References Cited

U.S. PATENT DOCUMENTS 7,781,258 B2 * 8/2010 Toba et al. .................... 438/107
2002/0011327 A1 1/2002 Fukazu et al.

(Continued)

FOREIGN PATENT DOCUMENTS

CN 101156241 A 4/2008
CN 101473432 A 7/2009

(Continued)

OTHER PUBLICATIONS

Extended European Search Report issued in European counterpart application No. EP10808068.0, dated Dec. 3, 2013.

(Continued)

*Primary Examiner* — Alexander Oscar Williams
(74) *Attorney, Agent, or Firm* — Rossi, Kimms & McDowell LLP

(57) ABSTRACT

A semiconductor module including a cooling unit by which a fine cooling effect is obtained is provided. A plurality of cooling flow paths (21*c*) which communicate with both of a refrigerant introduction flow path which extends from a refrigerant introduction inlet and a refrigerant discharge flow path which extends to a refrigerant discharge outlet are arranged in parallel with one another in a cooling unit (20). Fins (22) are arranged in each cooling flow path (21*c*). Semiconductor elements (32) and (33) are arranged over the cooling unit (20) so that the semiconductor elements (32) and (33) are thermally connected to the fins (22). By doing so, a semiconductor module (10) is formed. Heat generated by the semiconductor elements (32) and (33) is conducted to the fins (22) arranged in each cooling flow path (21*c*) and is removed by a refrigerant which flows along each cooling flow path (21*c*).

12 Claims, 19 Drawing Sheets

10 30 30 31 30 30 25 23 L L 20 30 33 33 32 32 30 21

10 31 31c 31a 31b 33 34 32 30 34 30 30 23 20 21c 21 21c 22 c 26 35 21c

(56) References Cited

U.S. PATENT DOCUMENTS

| | | | | |
|---|---|---|---|---|
| 2006/0225867 | A1 | 10/2006 | Park et al. | |
| 2007/0044952 | A1 | 3/2007 | Kuno et al. | |
| 2007/0227697 | A1 | 10/2007 | Takahashi | |
| 2008/0239671 | A1 | 10/2008 | Amano et al. | |
| 2009/0095960 | A1* | 4/2009 | Murayama | 257/79 |
| 2009/0139704 | A1 | 6/2009 | Otoshi et al. | |
| 2009/0178792 | A1 | 7/2009 | Mori et al. | |
| 2009/0250195 | A1 | 10/2009 | Yoshida et al. | |
| 2012/0139096 | A1* | 6/2012 | Gohara et al. | 257/706 |
| 2012/0140420 | A1* | 6/2012 | Soyano et al. | 361/715 |
| 2013/0058041 | A1* | 3/2013 | Gohara et al. | 361/699 |

FOREIGN PATENT DOCUMENTS

| | | | |
|---|---|---|---|
| CN | 101489371 | A | 7/2009 |
| EP | 0196863 | A1 | 10/1986 |
| EP | 0838988 | A2 | 4/1998 |
| EP | 1729557 | A2 | 12/2006 |
| JP | 04002156 | A | 1/1992 |
| JP | 2000-340727 | A | 12/2000 |
| JP | 2001-024125 | A | 1/2001 |
| JP | 2001-024126 | A | 1/2001 |
| JP | 2001-352025 | A | 12/2001 |
| JP | 2002046482 | A | 2/2002 |
| JP | 2002-093974 | A | 3/2002 |
| JP | 2002368169 | A | 12/2002 |
| JP | 2004186702 | A | 7/2004 |
| JP | 2004-296748 | A | 10/2004 |
| JP | 2004295718 | A | 10/2004 |
| JP | 2005191082 | A | 7/2005 |
| JP | 2006-179771 | A | 7/2006 |
| JP | 2006-295178 | A | 10/2006 |
| JP | 2007-012722 | A | 1/2007 |
| JP | 2007-236044 | A | 9/2007 |
| JP | 2007-324351 | A | 12/2007 |
| JP | 2008103400 | A | 5/2008 |
| JP | 2008171840 | A | 7/2008 |
| JP | 2008-251932 | A | 10/2008 |
| JP | 2008-252964 | A | 10/2008 |
| JP | 2008-288330 | A | 11/2008 |
| JP | 2009-135477 | A | 6/2009 |
| JP | 2009-283766 | A | 12/2009 |

OTHER PUBLICATIONS

First Office Action issued in Corresponding Chinese Patent Application No. 2010800290381, dated Mar. 4, 2014, English translation provided.

Japanese Office Action cited in Japanese counterpart application No. JP2012501045, dated Aug. 5, 2014. English translation provided.

* cited by examiner

SEMICONDUCTOR MODULE AND COOLING UNIT

This application is a U. S. National Phase Application of PCT International Application PCT/JP2010/004791, filed on Jul. 28, 2010, which is based on and claims priority from JP 2009-185722, filed on Aug. 10, 2009. The contents of the documents cited in this paragraph are hereby incorporated herein by reference in their entireties.

TECHNICAL FIELD

This invention relates to a semiconductor module including a semiconductor element and a cooling unit for cooling the semiconductor element included in the semi-conductor module.

BACKGROUND ART

A technique using a heat sink with pin-like or plate-like fins is widely known as one of techniques for cooling a semiconductor element which generates heat at the time of operation. In addition, for example, a technique for cooling a semiconductor element by passing a refrigerant along a refrigerant flow path formed of a hole, a partition wall, a fin, and the like in a determined member of a cooling jacket or the like thermally connected to the semiconductor element is also known. Cooling systems include an air cooling system and a liquid cooling system which differ in kind of refrigerant used.

CITATION LIST

Patent Literature

PTL 1: Japanese Publication 2000-340727
PTL 2: Japanese Publication 2001-24125
PTL 3: Japanese Publication 2002-93974
PTL 4: Japanese Publication 2006-295178
PTL 5: Japanese Publication 2007-12722
PTL 6: Japanese Publication 2007-324351
PTL 7: Japanese Publication 2008-251932
PTL 8: Japanese Publication 2008-288330

SUMMARY OF INVENTION

Technical Problem

With the conventional cooling techniques, however, it may be impossible to cool a semiconductor element adequately or uniformly, depending on, for example, the shape or arrangement of a heat sink (fins) or a refrigerant flow path. Lack of cooling may cause a malfunction or a break in the semiconductor element due to heat generation.

The present invention was made under the background circumstances described above. An object of the present invention is to provide a semiconductor module including a cooling unit which can cool a semiconductor element effectively.

Still another object of the present invention is to provide a cooling unit which can be applied to a semiconductor module.

Solution to Problem

According to an aspect of the present invention, there is provided a semiconductor module including a cooling unit having a first flow path which extends from a refrigerant introduction inlet, a second flow path which is arranged in parallel with the first flow path and which extends to a refrigerant discharge outlet, a plurality of third flow paths which communicate with the first flow path and the second flow path, and a heat sink which is arranged in the plurality of third flow paths; and at least one semi-conductor element which is thermally connected to the cooling unit.

Advantageous Effects of Invention

With the semiconductor module according to the present invention, the semi-conductor element included therein can be cooled effectively by the cooling unit and be made to operate stably.

The above and other objects, features and advantages of the present invention will become apparent from the following Description when taken in conjunction with the accompanying drawings which illustrate preferred embodiments of the present invention by way of example.

DESCRIPTION OF EMBODIMENTS

Figure 1:
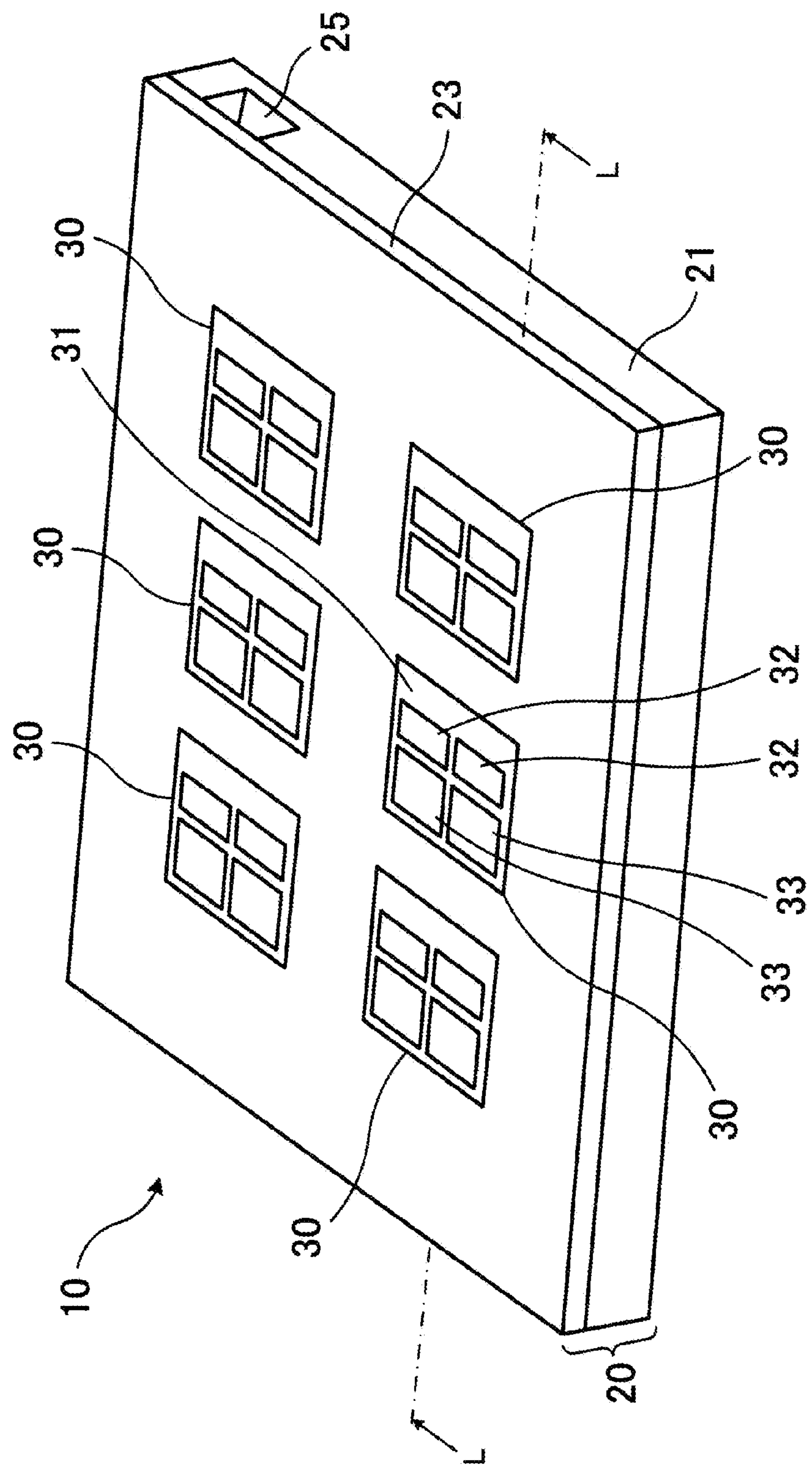
FIG. 1 is a schematic perspective view of an example of a semiconductor module.
Figure 2:
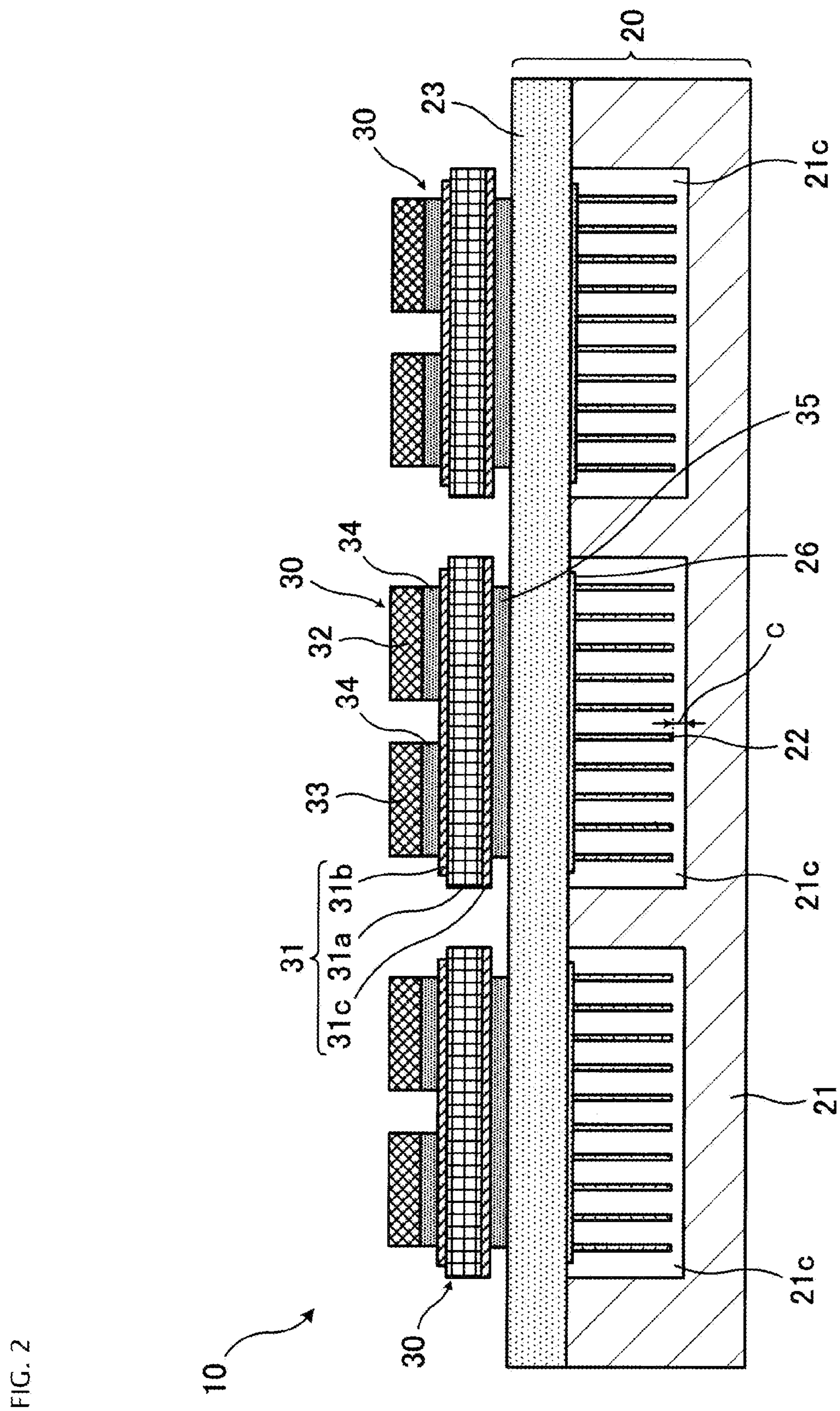
FIG. 2 is a schematic sectional view taken along the dot-dash line of FIG. 1.
Figure 3:
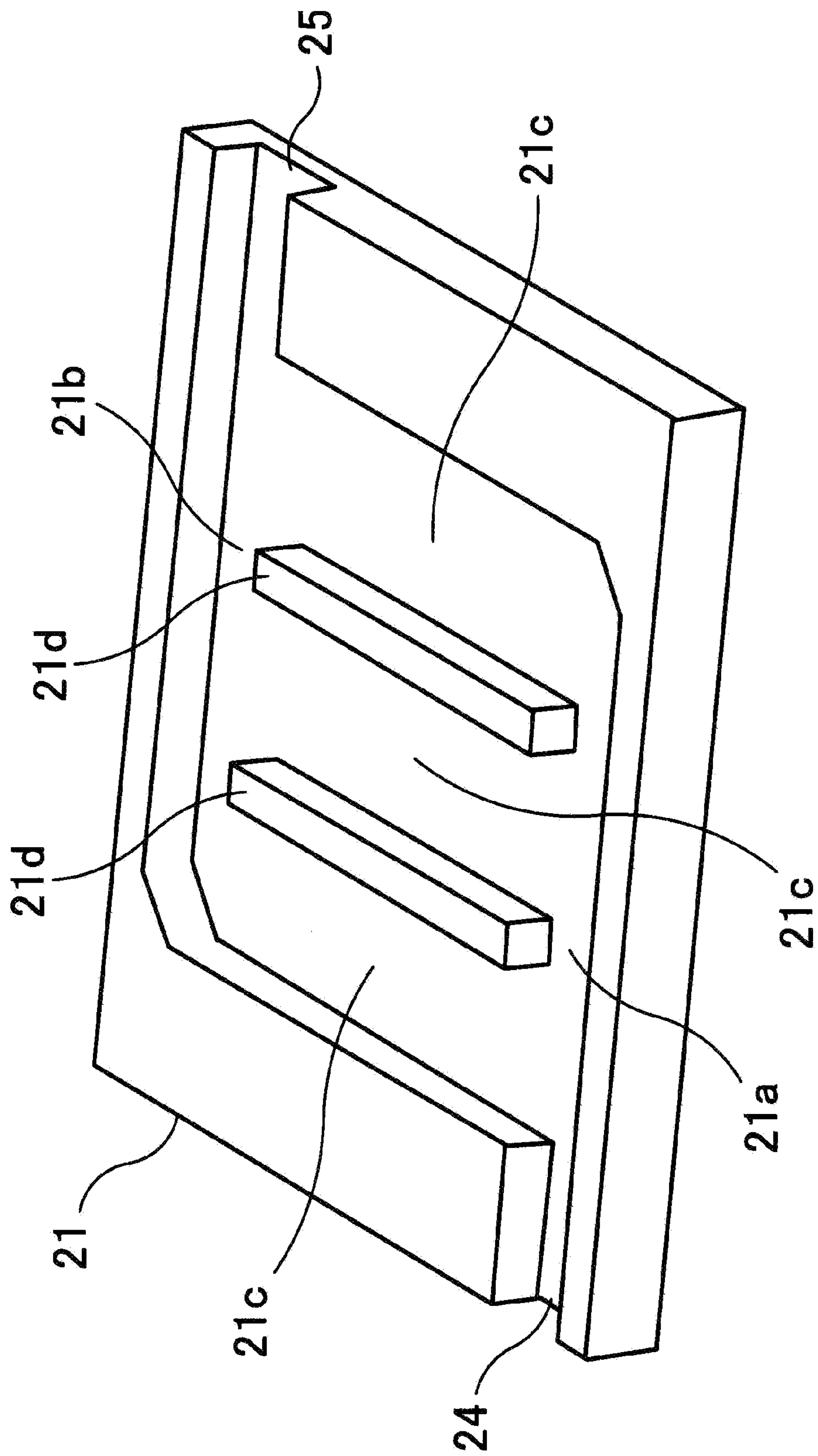
FIG. 3 is a fragmentary schematic perspective view of an example of a cooling unit.

FIG. 1 is a schematic perspective view of an example of a semiconductor module. FIG. 2 is a schematic sectional view taken along the dot-dash line of FIG. 1. FIG. 3 is a fragmentary schematic perspective view of an example of a cooling unit.

A semiconductor module 10 illustrated in FIG. 1 includes a cooling unit 20 and a plurality of circuit element sections 30 arranged over the cooling unit 20. As illustrated in FIGS. 1 and 2, the cooling unit 20 includes an enclosure (fin cover) 21 and a fin base 23 having fins (heat sink) 22.

As illustrated in FIG. 3, a refrigerant introduction flow path 21*a*, a refrigerant discharge flow path 21*b*, and a plurality of (three, in this example) cooling flow paths 21*c* are formed in one surface of the enclosure 21 of the cooling unit 20. In addition, a refrigerant introduction inlet 24 for introducing a refrigerant into the inside of the enclosure 21 and a refrigerant discharge outlet 25 for discharging the refrigerant introduced into the inside of the enclosure 21 to the outside of the enclosure 21 are formed in opposite sides of the enclosure 21. A cross section of each of the refrigerant introduction flow path 21*a*, the refrigerant discharge flow path 21*b*, the cooling flow paths 21*c*, the refrigerant introduction inlet 24, and the refrigerant discharge outlet 25 is approximately square. They are equal in depth. There is no difference in level at their bottoms, that is to say, their bottoms are flat.

The refrigerant introduction flow path 21*a* extends straight from the refrigerant introduction inlet 24 formed in one side of the enclosure 21. The refrigerant discharge flow path 21*b* is formed in parallel with the refrigerant introduction flow path 21*a* and extends straight to the refrigerant discharge outlet 25 formed in a side of the enclosure 21 opposite to the side in which the refrigerant introduction inlet 24 is formed. The plurality of cooling flow paths 21*c* are formed between a plurality of partition walls 21*d* formed in parallel with one another in an area between the refrigerant introduction flow path 21*a* and the refrigerant discharge flow path 21*b* formed in parallel with each other.

The plurality of cooling flow paths 21*c* are formed in parallel with one another between the refrigerant introduction flow path 21*a* and the refrigerant discharge flow path 21*b* and communicate with the refrigerant introduction flow path 21*a* and the refrigerant discharge flow path 21*b*. In this example, the plurality of cooling flow paths 21*c* extend in the direction perpendicular to the direction in which the refrigerant introduction flow path 21*a* and the refrigerant discharge flow path 21*b* extend.

The refrigerant introduced into the enclosure 21 from the refrigerant introduction inlet 24 flows along the refrigerant introduction flow path 21*a*, the plurality of cooling flow paths 21*c*, and the refrigerant discharge flow path 21*b* and is discharged from the refrigerant discharge outlet 25.

The enclosure 21 having the above structure can be formed by the use of a metal material such as aluminum, an alloy of aluminum, copper, or an alloy of copper. If the enclosure 21 is formed by the use of a metal material, then the enclosure 21 can be formed by, for example, die casting so that the enclosure 21 will have the above refrigerant introduction flow path 21*a*, refrigerant discharge flow path 21*b*, plurality of cooling flow paths 21*c*, refrigerant introduction inlet 24, and refrigerant discharge outlet 25.

A material which contains a carbon filler can be used in place of a metal material for forming the enclosure 21. In addition, a ceramic material, a resin material, or the like can be used for forming the enclosure 21, depending on the kind of the refrigerant used, the temperature of the refrigerant which flows in the enclosure 21, or the like.

The enclosure 21 has the above structure. As illustrated in FIGS. 1 and 2, a fin base 23 is placed over the surface of this enclosure 21 in which the refrigerant introduction flow path 21*a*, the refrigerant discharge flow path 21*b*, and the plurality of cooling flow paths 21*c* are formed. A plurality of fins 22 are arranged over the fin base 23. Each fin 22 is formed on, for example, a base member 26. The base member 26 on which fins 22 are formed is integrated with the fin base 23. When the fin base 23 is placed with the fins 22 facing the enclosure 21, the fins 22 are arranged in each cooling flow path 21*c* of the enclosure 21.

An example of the shape of the fins 22 will now be described.

Figure 4:
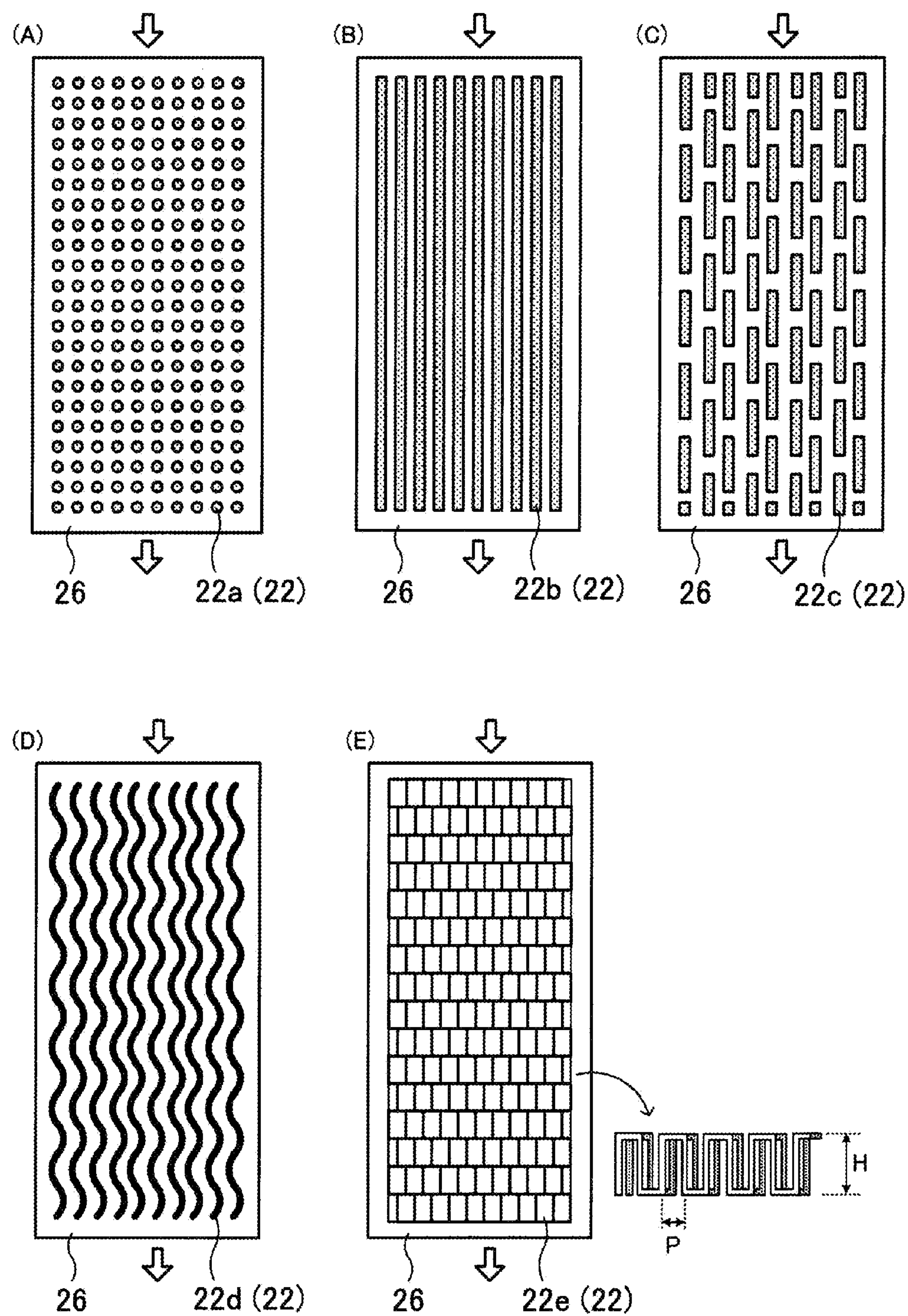
FIG. 4 illustrates an example of the shape of a fin.

FIG. 4 illustrates an example of the shape of a fin.

As illustrated in FIG. 4(A), for example, the fins 22 may be pin-like fins 22*a* vertically and horizontally arranged in a regular manner. These pin-like fins 22*a* are held by the base member 26 and the fin base 23 and are arranged in the cooling flow paths 21*c*. The refrigerant flows in a direction indicated by arrows in FIG. 4(A).

As illustrated in FIG. 4(B), for example, the fins 22 may be plate-like fins 22*b* arranged in parallel with one another. The plate-like fins 22*b* are arranged so that they will extend in a direction which is indicated by arrows in FIG. 4(B) and in which the refrigerant flows (in which the cooling flow paths 21*c* extend). These plate-like fins 22*b* are held by the base member 26 and the fin base 23 and are arranged in the cooling flow paths 21*c*. In FIG. 4(B), the flat-plate-like fins 22*b* are illustrated. However, corrugated-plate-like fins 22*d* (FIG. 4(D)), staggered fins 22*c* (FIG. 4(C)), corrugated fins 22*e* (FIG. 4(E)) which are formed at pitches of P and which are H in height, or the like can be used.

As stated above, the fins 22 may be pin-like fins, flat-plate-like fins, corrugated-plate-like fins, or the like. As illustrated in FIG. 2, for example, these fins 22 are integrated with the fin base 23. The size (height) of the fins 22 is set so that when the fin base 23 is placed with the fins 22 facing the enclosure 21, there will be constant clearance C between their tips and the internal bottom of the enclosure 21.

As stated above, fins having various shapes, such as pin-like fins, flat-plate-like fins, or corrugated-plate-like fins, can be used as the fins 22. With the cooling unit 20, however, the fins 22 are arranged in the cooling flow paths 21*c*. Therefore, the fins 22 may give resistance to the refrigerant which flows along the cooling flow paths 21*c*, depending on the shape or size of the fins 22. In that case, pressure loss occurs. Attention should be paid to this. The shape and size of the fins 22 are set properly with conditions under which the refrigerant is introduced into the cooling unit 20 (pump performance and the like), the kind of the refrigerant (viscosity and the like), a target heat removal amount, and the like taken into consideration.

The fins 22 and the fin base 23 can be formed by the use of, for example, a metal material such as aluminum, an alloy of aluminum, copper, or an alloy of copper. The fins 22 can be formed by, for example, bonding determined pins or plates (above pin-like fins 22*a*, flat-plate-like fins 22*b*, or the like) formed by the use of a metal material to the metal base member 26. The base member 26 to which the fins 22 are bonded in this way is bonded to a determined area of the fin base 23 of, for example, a metal plate, that is to say, to an area corresponding to each cooling flow path 21*c* illustrated in FIG. 2.

Instead of bonding the base member 26 to which a plurality of pin-like or flat-plate-like fins 22, for example, are bonded in advance to the fin base 23 in this way, a plurality of pin-like or flat-plate-like fins 22 can be bonded directly to the fin base 23.

As illustrated in FIGS. 1 and 2, the fin base 23 with which the fins 22 are finally integrated is then placed over the enclosure 21. The fin base 23 and the enclosure 21 are bonded together by the use of, for example, a proper sealing material (not illustrated). By doing so, the cooling unit 20 including the enclosure 21, the fins 22, and the fin base 23 is formed.

At the time of the use of the cooling unit 20, for example, the refrigerant introduction inlet 24 is connected to a pump installed on the upstream side and the refrigerant discharge outlet 25 is connected to a heat exchanger installed on the downstream side. As a result, a refrigerant flow path which is a closed loop and which includes the cooling unit 20, the pump, and the heat exchanger is formed. The pump forces the refrigerant to circulate along this closed loop.

As illustrated in FIGS. 1 and 2, the plurality of circuit element sections 30 are arranged (in this example, circuit element sections 30 are arranged in two rows and three columns, that is to say, a total of six circuit element sections 30 are arranged) over the cooling unit 20.

As illustrated in FIG. 1, for example, each circuit element section 30 includes two kinds of semiconductor elements mounted over a board 31. Each circuit element section 30 includes two semiconductor elements 32 and two semiconductor elements 33, that is to say, a total of four semiconductor elements. As illustrated in FIG. 2, for example, the board 31 is obtained by forming conductor patterns 31*b* and 31*c* over both surfaces of an insulating board 31*a*.

A ceramic board of aluminum nitride, aluminum oxide, or the like can be used as the insulating board 31*a* of the board 31. The conductor patterns 31*b* and 31*c* over the insulating board 31*a* can be formed by the use of metal such as copper (copper foil).

In this example, power semiconductor elements are used as the semiconductor elements 32 and 33 mounted over the board 31 having the above structure. For example, the semiconductor elements 32 are FWDs (Free Wheeling Diodes) and the semiconductor elements 33 are IGBTs (Insulated Gate Bipolar Transistors).

The semiconductor elements 32 and 33 are bonded to the conductor pattern 31*b* side of the board 31 by the use of a bonding layer 34 of solder or the like and are electrically connected to the conductor pattern 31*b* directly or via wires (not illustrated). The conductor pattern 31*c* side of the board 31 over which the semiconductor elements 32 and 33 are mounted is bonded to the fin base 23 of the cooling unit 20 via a bonding layer 35. The board 31, the semiconductor elements 32 and 33 mounted over the board 31, and the cooling unit 20 are thermally connected to one another.

Protection layers for protecting against contamination, corrosion, external force, or the like may be formed by, for example, nickel plating over the exposed surfaces of the conductor patterns 31*b* and 31*c* and the surfaces of the wires via which the semi-conductor elements 32 and 33 and the conductor pattern 31*b* are electrically connected.

In this example, a total of six circuit element sections 30 each having the above structure are arranged over the fin base 23 of the cooling unit 20. For example, these circuit element sections 30 can be connected so that an inverter circuit will be formed over the cooling unit 20.

Figure 5:
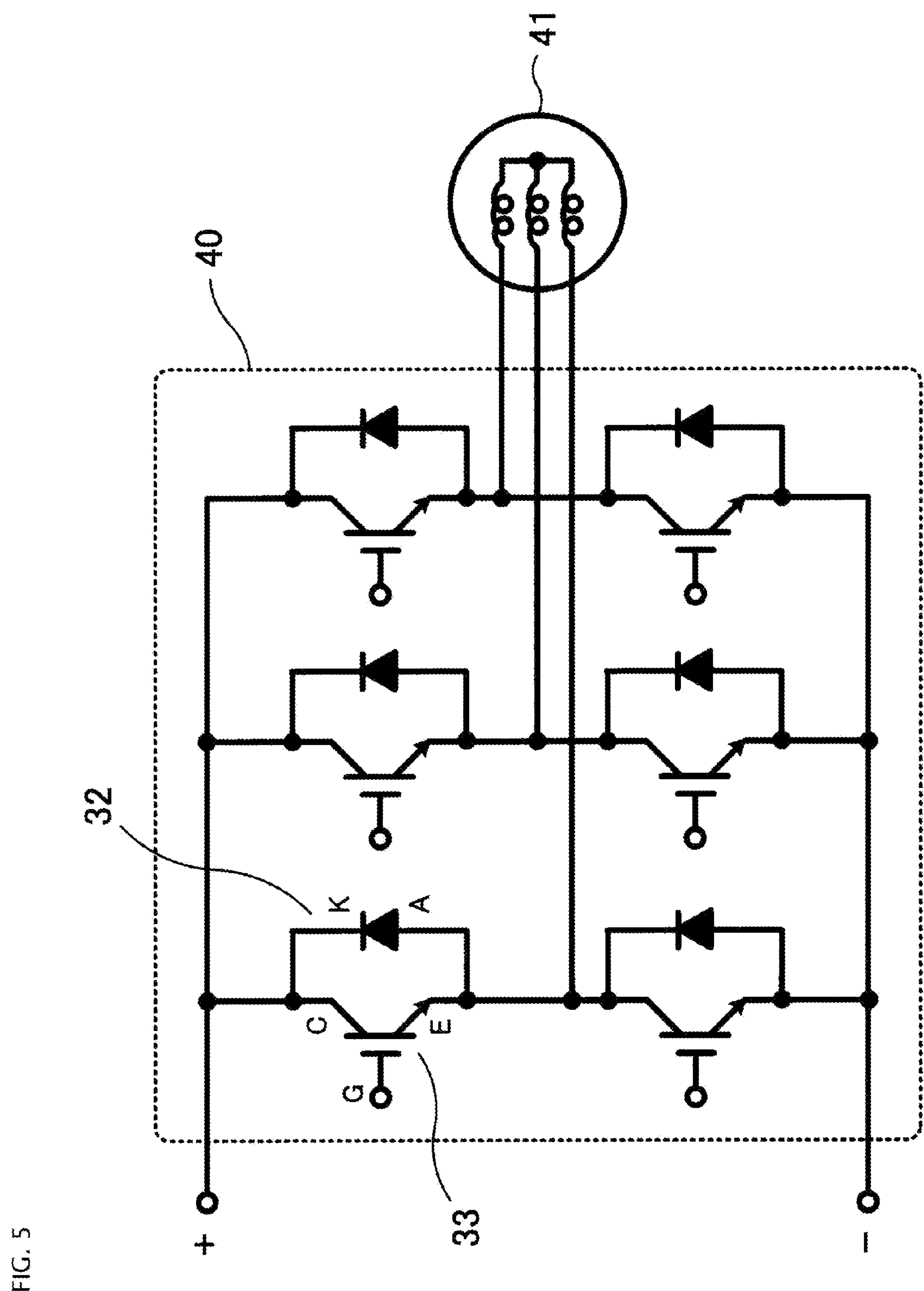
FIG. 5 illustrates an example of a circuit diagram of the semiconductor module.

FIG. 5 illustrates an example of a circuit diagram of the semiconductor module.

In FIG. 5, an inverter circuit 40 for converting direct current to alternating current and supplying it to a three-phase AC motor 41 is illustrated. The inverter circuit 40 includes a bridge circuit consisting of semiconductor elements 33, which are IGBTs, and semiconductor elements 32, which are FWDs, for each of the three phases, that is to say, for each of the U phase, the V phase, and the W phase. By controlling the switching of the semiconductor elements 33, direct current can be converted to alternating current and the three-phase AC motor 41 can be driven.

With the above semiconductor module 10, for example, two such inverter circuits 40 can be formed by the use of the six circuit element sections 30.

As illustrated in FIG. 2, each circuit element section 30 arranged over the cooling unit 20 is arranged in an area corresponding to a cooling flow path 21*c* of the cooling unit 20 over the cooling flow path 21*c*. In the above example, two circuit element sections 30 arranged in a column in FIG. 1 are arranged over one cooling flow path 21*c* illustrated in FIGS. 2 and 3.

Heat generated by each circuit element section 30 at the time of operation is transferred to the fin base 23 to which it is bonded and is then transferred to fins 22 under the fin base 23. As stated above, the fins 22 are arranged in a cooling flow path 21*c*. The refrigerant flows along the cooling flow path 21*c*, so the fins 22 are cooled. Each circuit element section 30 which generates heat is cooled in this way by the cooling unit 20.

With the semiconductor module 10, as has been described, a circuit element section 30 is arranged at a position corresponding to a cooling flow path 21*c* on the upper side of the fin base 23 of the cooling unit 20 and fins 22 are arranged at a position in the cooling flow path 21*c* corresponding to the circuit element section 30 on the under side of the fin base 23. Therefore, compared with the case where the fins 22 are not arranged in the cooling flow path 21*c* and where cooling is performed only by making the refrigerant flow along the cooling flow path 21*c*, the circuit element section 30 can be cooled effectively.

In addition, with the semiconductor module 10 the three cooling flow paths 21*c* are formed in parallel with one another between the refrigerant introduction flow path 21*a* and the refrigerant discharge flow path 21*b*. As a result, pressure loss which occurs during a period from the introduction of the refrigerant from the refrigerant introduction inlet 24 to a discharge of the refrigerant from the refrigerant discharge outlet 25 can be reduced. Accordingly, the refrigerant can be made to flow in the cooling unit 20 at a certain flow velocity or greater and the circuit element section 30 can be cooled effectively. The details of this point will be described later.

In the above Description, the case where the number of the circuit element sections 30 included in the semiconductor module 10 is six is taken as an example. However, the number of the circuit element sections 30 included in the semiconductor module 10 is not limited to six.

Figure 6:
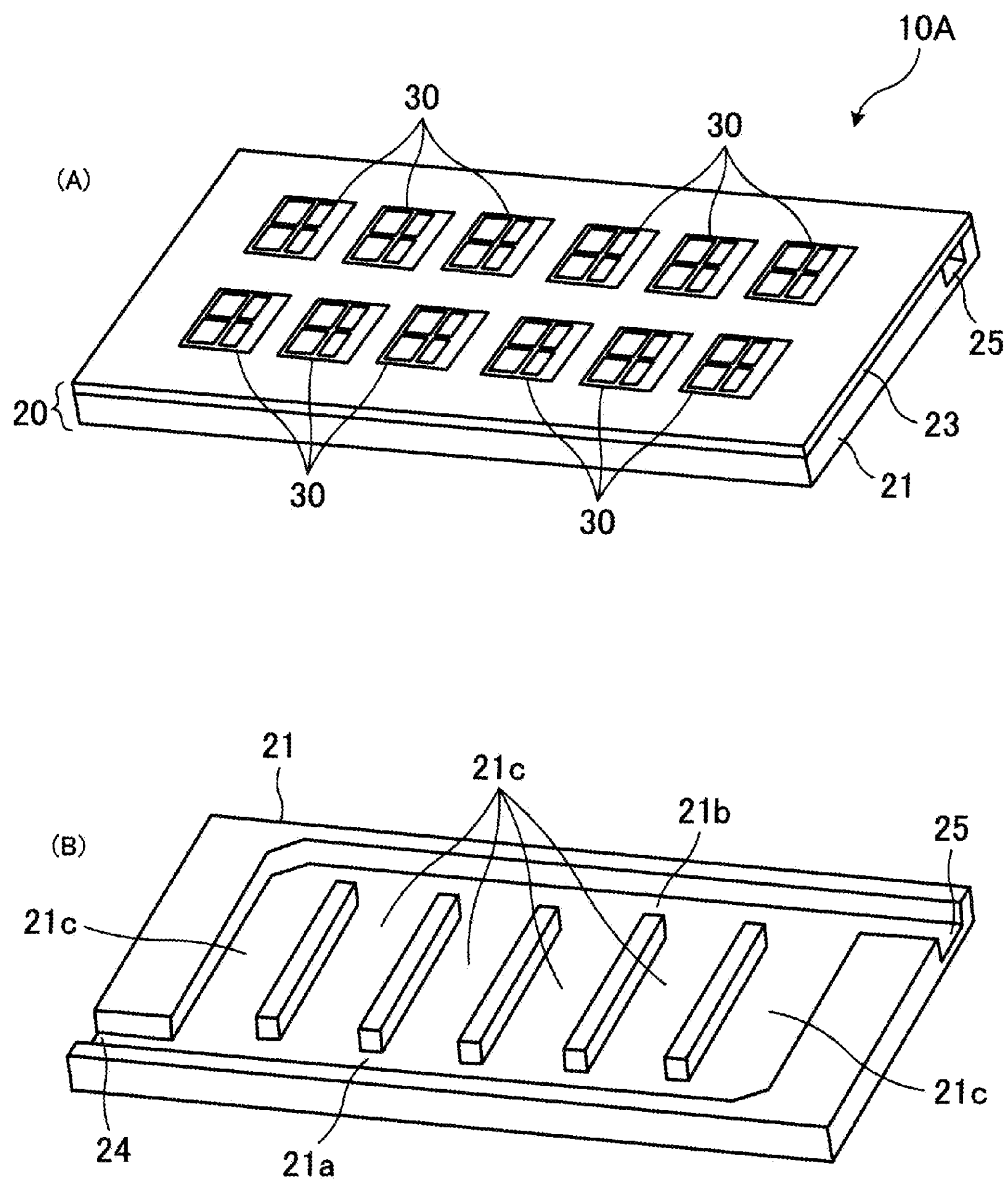
FIG. 6 illustrates a first modification of the semiconductor module.

FIG. 6 illustrates a first modification of the semiconductor module. FIG. 6(A) is a schematic perspective view of a semiconductor module and FIG. 6(B) is a fragmentary schematic perspective view of an enclosure of a cooling unit.

With a semiconductor module 10A illustrated in FIG. 6(A), circuit element sections 30 are arranged in two rows and six columns, that is to say, a total of twelve circuit element sections 30 are arranged over a cooling unit 20. By combining these circuit element sections 30 properly and connecting them, a plurality of inverter circuits 40 like that illustrated in the above FIG. 5, for example, can be formed.

With the semiconductor module 10A having the above structure, as illustrated in FIG. 6(B), six cooling flow paths 21*c*, for example, are formed in an enclosure 21 of the cooling unit 20. Fins 22 to be arranged in each cooling flow path 21*c* are arranged over a fin base 23 placed over the enclosure 21.

With the semiconductor module 10A illustrated in FIG. 6(A), two circuit element sections 30 arranged in a column are arranged in an area corresponding to a cooling flow path 21*c* over the cooling flow path 21*c*. This is the same with the above example illustrated in FIG. 2.

Figure 7:
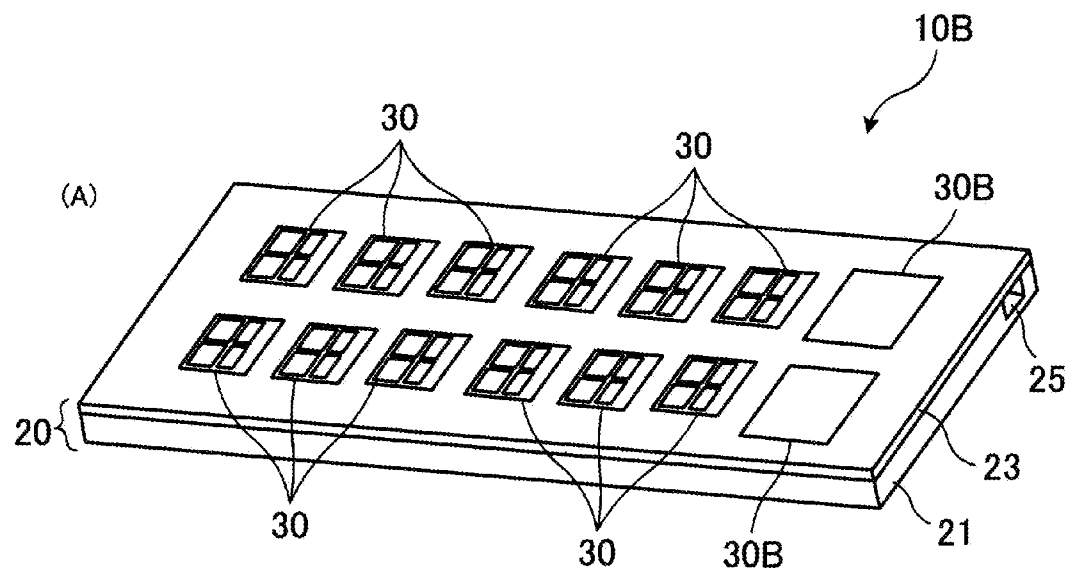
FIG. 7 illustrates a second modification of the semiconductor module.
Figure 7:
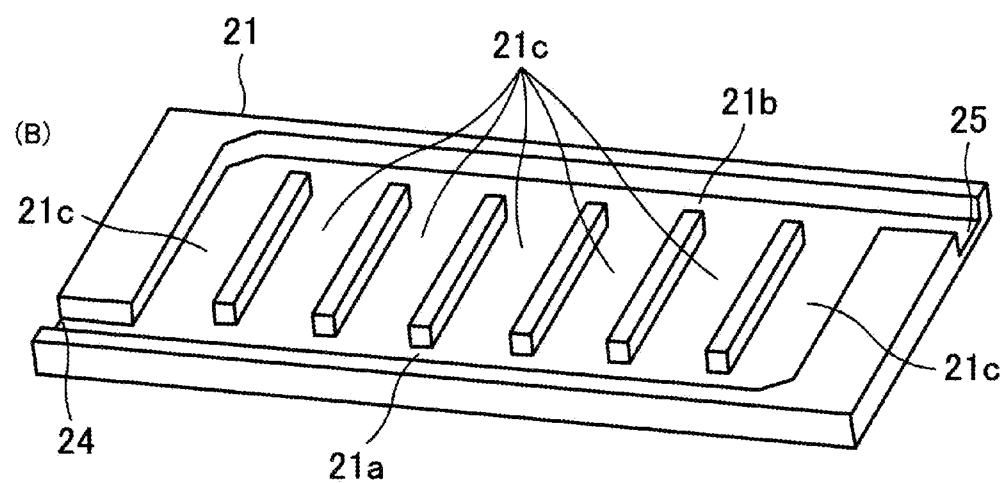

FIG. 7 illustrates a second modification of the semiconductor module. FIG. 7(A) is a schematic perspective view of a semiconductor module and FIG. 7(B) is a fragmentary schematic perspective view of an enclosure of a cooling unit.

With a semiconductor module 10B illustrated in FIG. 7(A), two circuit element sections 30B are arranged over a cooling unit 20 in addition to circuit element sections 30 arranged in two rows and six columns. The two additional circuit element sections 30B may differ from the other twelve circuit element sections 30 in structure.

By combining the twelve circuit element sections 30 properly and connecting them, a plurality of inverter circuits 40 like that illustrated in the above FIG. 5, for example, can be formed. For example, a circuit element section 30B may be a step-up converter circuit formed by the use of a determined number of IGBTs and FWDs. In this case, for example, the following circuit structure can be adopted. The circuit element section 30B of the step-up converter circuit is connected to a battery and the above inverter circuit 40. Battery voltage is increased by the circuit element section 30B. Voltage-increased direct current is converted to alternating current by the inverter circuit 40 and is supplied to the above three-phase AC motor 41.

If the circuit element sections 30B which differ from the circuit element sections 30 in type are newly added and a wiring layout and the like in design or manufacture are taken into consideration, it is comparatively easy, as illustrated in FIG. 7(A), to add the circuit element sections 30B to an edge portion of the semiconductor module 10B.

With the above semiconductor module 10B, for example, an enclosure 21 of the cooling unit 20 in which seven cooling flow paths 21*c* are formed is used as illustrated in FIG. 7(B). Fins 22 to be arranged in each cooling flow path 21*c* are arranged over a fin base 23 placed over the enclosure 21.

With the semiconductor module 10B illustrated in FIG. 7(A), two circuit element sections 30 or the two circuit element sections 30B arranged in a column are arranged in an area corresponding to a cooling flow path 21*c* over the cooling flow path 21*c*. This is the same with the above example illustrated in FIG. 2. In FIG. 7(A), the circuit element sections 30 are arranged on the refrigerant introduction inlet 24 side (over a cooling flow path 21*c* which communicates with the front end of a refrigerant introduction flow path 21*a*) and the additional circuit element sections 30B are arranged on the refrigerant discharge outlet 25 side (over a cooling flow path 21*c* which communicates with the rear end of a refrigerant introduction flow path 21*a*).

As illustrated in FIGS. 6 and 7, the number of the cooling flow paths 21*c* of the cooling unit 20 can be changed according to the number of the circuit element sections 30 and the like to be cooled.

By the way, in the cooling unit 20, as stated above, a plurality of cooling flow paths 21*c* perpendicular to the refrigerant introduction flow path 21*a* and the refrigerant discharge flow path 21*b* are formed in parallel with one another between the refrigerant introduction flow path 21*a* and the refrigerant discharge flow path 21*b*. As a result, a loss in the pressure of a refrigerant which occurs between the refrigerant introduction inlet 24 and the refrigerant discharge outlet 25 can be reduced. This point will now be described in further detail.

Factors which have an influence on the performance of the cooling unit 20 will be described first. For example, (1) material (thermal conductivity) for and shape of the fins 22, (2) performance of a pump for introducing a refrigerant, (3) properties (viscosity, thermal conductivity, temperature, and the like) of the refrigerant, and (4) shape (width, depth, plane shape, and the like) of refrigerant flow paths can be given as such factors. Attention will now be paid to an influence which factors (2) and (4) have on the cooling performance.

Figure 8:
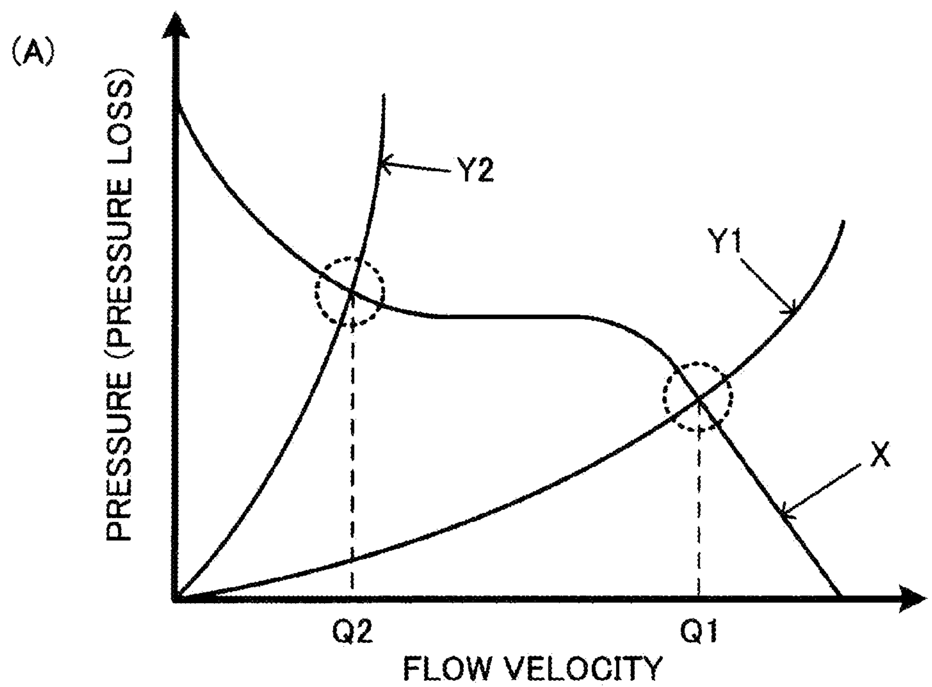
FIG. 8 is a view for describing the cooling performance of a cooling unit.
Figure 8:
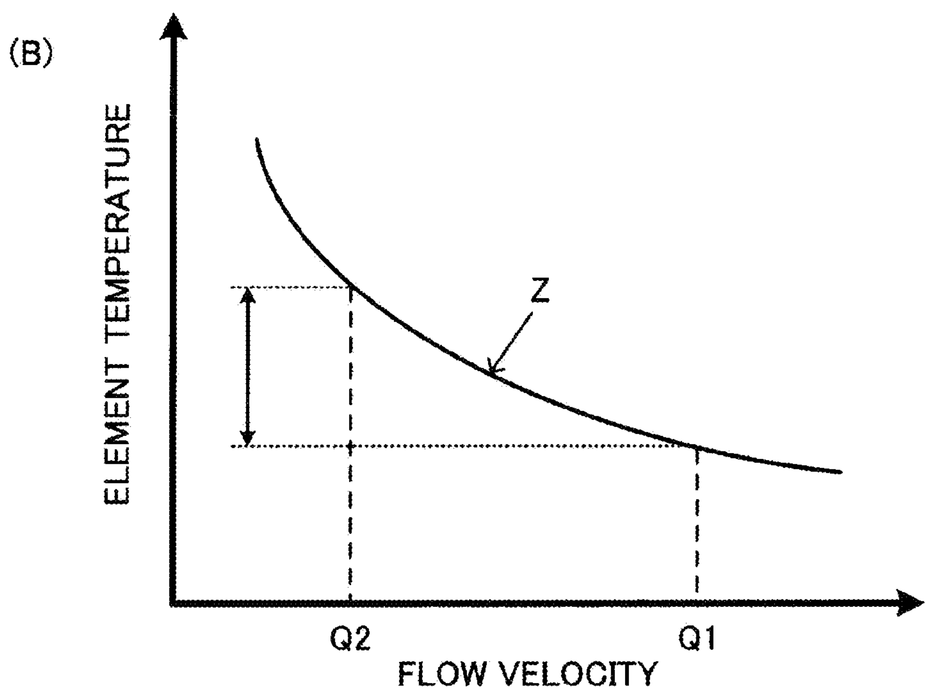

FIG. 8 is a view for describing the cooling performance of a cooling unit. FIG. 8(A) is a schematic view of the relationship between the flow velocity and pressure of a refrigerant and FIG. 8(B) is a schematic view of the relationship between the flow velocity of the refrigerant and the temperature of an element.

A curve X indicated in FIG. 8(A) represents pump performance. This performance is inherent in a pump used. Each of curves Y1 and Y2 indicated in FIG. 8(A) represents the relationship between flow velocity and pressure loss between a refrigerant introduction inlet and a refrigerant discharge outlet of a cooling unit. This relationship is calculated in design or by experiment according to cooling units used. The flow velocity of a refrigerant which each cooling unit can pass is determined by the position of a point at which the curve X which represents the performance of the pump used for refrigerant circulation and the curve Y1 or Y2 which represents the relationship between flow velocity and pressure loss intersect.

In the example indicated in FIG. 8(A), for example, the curve Y1 indicates that an increase in pressure loss is comparatively small in relation to an increase in the flow velocity of the refrigerant. In the case of the cooling unit from which the curve Y1 is obtained, the flow velocity of the refrigerant which the cooling unit can pass is Q1 given by a point at which the curve Y1 and the curve X intersect. On the other hand, the curve Y2 indicates that an increase in pressure loss is comparatively large in relation to an increase in the flow velocity of the refrigerant. In the case of the cooling unit from which the curve Y2 is obtained, the flow velocity of the refrigerant which the cooling unit can pass is Q2 (<Q1) given by a point at which the curve Y2 and the curve X intersect, and becomes lower.

The relationship between the flow velocity of the refrigerant and the temperature of an element is given by a curve Z of FIG. 8(B). As indicated by the curve Z of FIG. 8(B), there is a tendency for the temperature of the element to rise with a decrease in the flow velocity of the refrigerant. Therefore, compared with the case where the cooling unit which can pass the refrigerant at a flow velocity of Q1 is used, as a matter of course, it is difficult, in the case of using the cooling unit which can pass the refrigerant at a lower flow velocity of Q2, to control a rise in the temperature of the element.

In the case of the curve Y2, a great pressure loss occurs. Even if the cooling unit which exhibits behavior like that indicated by the curve Y2 is used, the flow velocity of the refrigerant which the cooling unit can pass can be increased by using a higher-performance pump. As a result, a rise in the temperature of the element can be controlled. However, the use of such a pump contributes to a significant increase in the cost of an electronic device or the like equipped with a semiconductor module including the cooling unit.

Accordingly, the use of a cooling unit in which pressure loss is small is an effective method for keeping the flow velocity of the refrigerant which can be passed at a certain value or larger and controlling a rise in the temperature of the element, while controlling an increase in the cost caused by a change in pump.

Results obtained by examining the cooling performance of the above-mentioned cooling unit 20 by simulations will now be described.

A cooling unit including an enclosure 21 like that illustrated in FIG. 7(B) in which seven cooling flow paths 21*c* are formed in parallel with one another between a refrigerant introduction flow path 21*a* and a refrigerant discharge flow path 21*b* is used as the cooling unit 20. For convenience' sake this enclosure 21 will be referred to as an enclosure of a parallel flow path type. For the sake of comparison with the cooling unit 20 cooling units including enclosures 100 and 110 illustrated in FIGS. 9(A) and 9(B), respectively, are also used.

Figure 9:
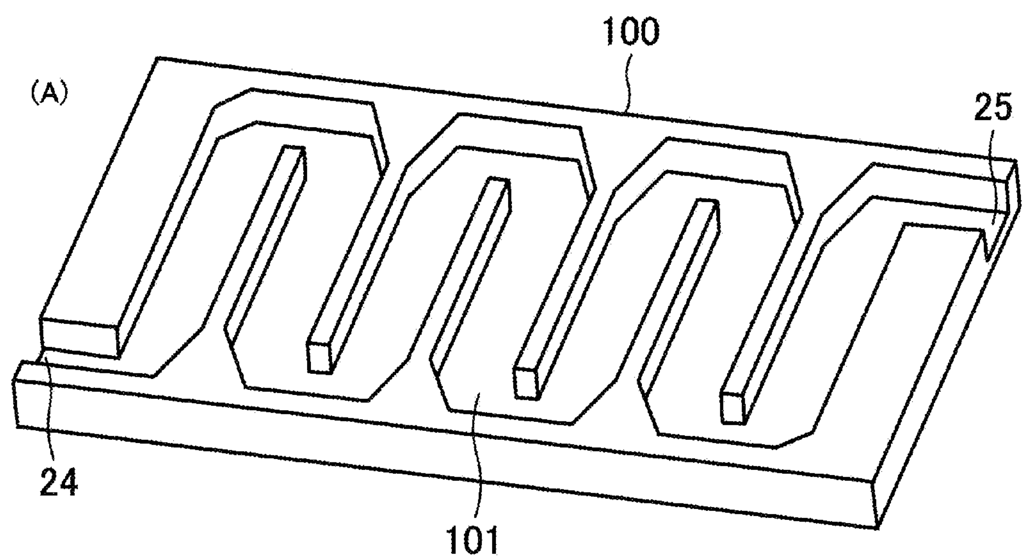
FIG. 9 is a schematic perspective view of another example of an enclosure.
Figure 9:
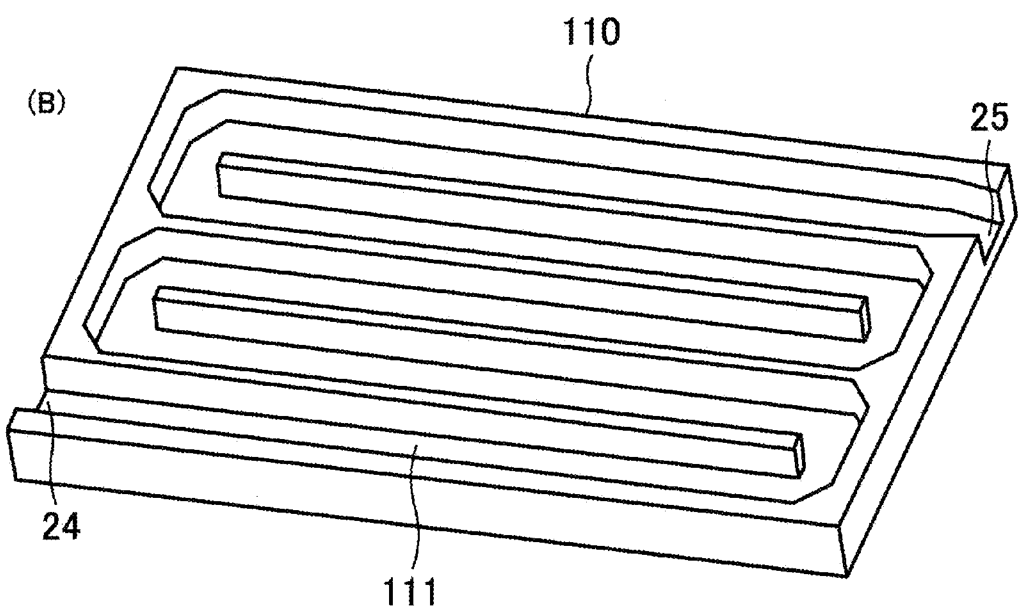

With the enclosure 100 illustrated in FIG. 9(A), a refrigerant introduction inlet 24 and a refrigerant discharge outlet 25 connect by one flow path 101. The flow path 101 of the enclosure 100 meanders to the arrangement of circuit element sections 30 and 30B arranged (in two rows and seven columns) over the flow path 101 of the enclosure 100. This is the same with the above cooling unit 20. For convenience' sake this enclosure 100 will be referred to as an enclosure of a seven-stage meandering flow path type.

With the enclosure 110 illustrated in FIG. 9(B), a refrigerant introduction inlet 24 and a refrigerant discharge outlet 25 connect by one flow path 111. This is the same with the enclosure 100 illustrated in FIG. 9(A). However, the flow path 111 of the enclosure 110 illustrated in FIG. 9(B) meanders so that it will extend in the direction of rows in which circuit element sections 30 and 30B are arranged over the enclosure 110. For convenience' sake this enclosure 110 will be referred to as an enclosure of a five-stage meandering flow path type.

The result of simulating the distribution of the flow velocity of the refrigerant which flows in the enclosure 21 of the parallel flow path type (FIG. 7(B)) will be described first.

Figure 10:
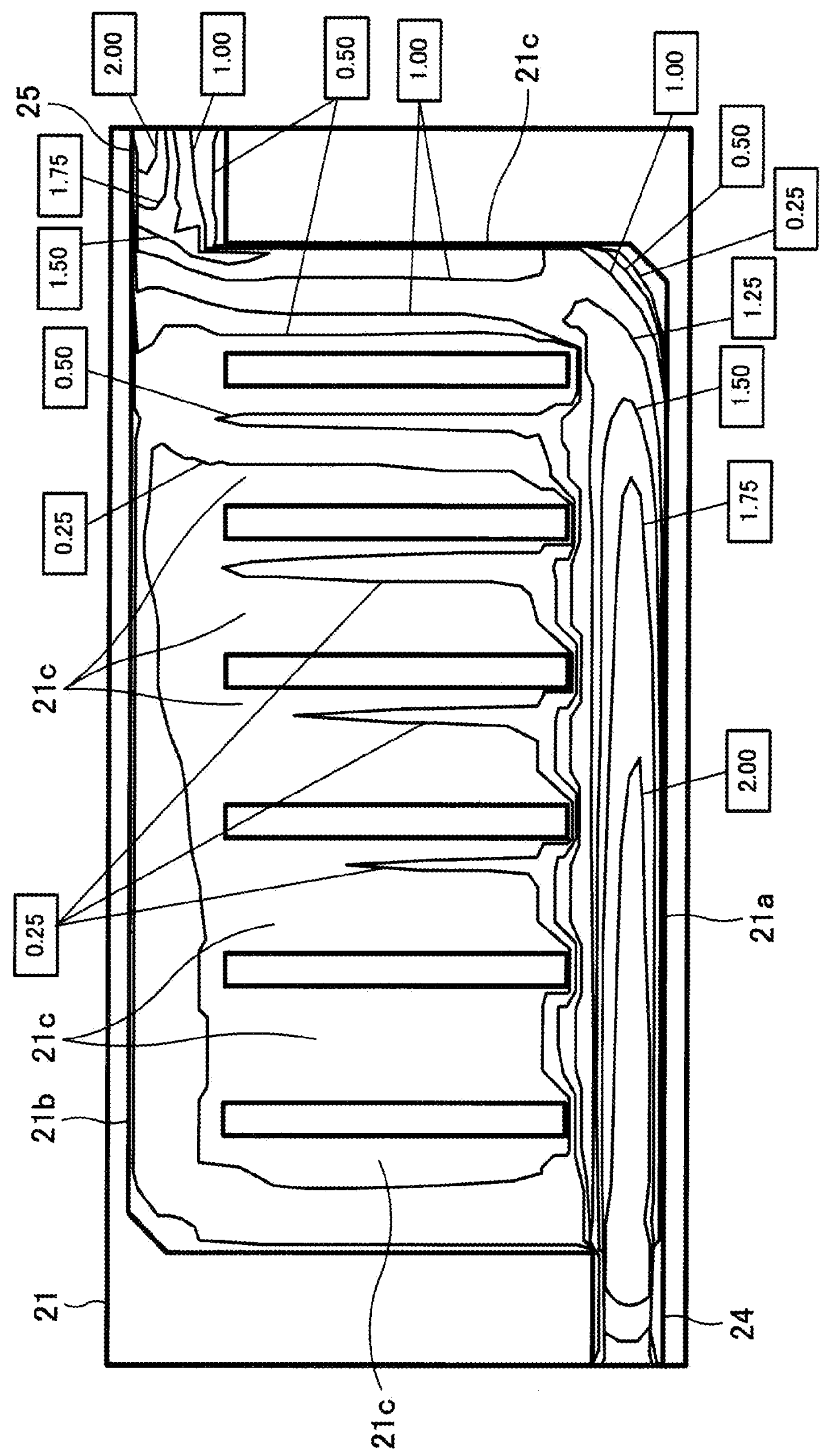
FIG. 10 illustrates an example of the result of simulating the distribution of flow velocity.

FIG. 10 illustrates an example of the result of simulating the distribution of flow velocity.

A thermal fluid analysis using two equations including the physical phenomena of a flow and heat transfer is adopted as a simulation method. This analysis is performed in a steady operation state. Results are obtained by taking a margin into consideration, increasing chip loss by 20 percent, and setting refrigerant temperature to a value which is higher than an estimated value by 10 degree C.

The enclosure 21 passes the refrigerant introduced from the refrigerant introduction inlet 24 to the cooling flow paths 21*c* and then to the refrigerant discharge flow path 21*b* and discharges the refrigerant from the refrigerant discharge outlet 25. In FIG. 10, figures (0.25, 0.50, 0.75, 1.00, 1.25, 1.50, 1.75, and 2.00) enclosed by squares represent flow velocity (m/s).

As a result of simulating the distribution of the flow velocity of the refrigerant, as illustrated in FIG. 10, the refrigerant introduced into the enclosure 21 from the refrigerant introduction inlet 24 flows at a high flow velocity along the refrigerant introduction flow path 21*a* which extends straight from the refrigerant introduction inlet 24. As can be seen from FIG. 10, the refrigerant then flows especially into the cooling flow path 21*c* of the plurality of cooling flow paths 21*c* nearest the refrigerant discharge outlet 25, that is to say, which communicates with the rear end of the refrigerant introduction flow path 21*a* at a comparatively high flow velocity with uniform distribution of the flow velocity. The result indicated in FIG. 10 is obtained by performing a simulation on the enclosure 21 in which there is no difference in level between the refrigerant introduction inlet 24 and the refrigerant introduction flow path 21*a*. If there is a difference in level between the refrigerant introduction inlet 24 and the refrigerant introduction flow path 21*a*, then the flow velocity becomes lower in the cooling flow path 21*c* which communicates with the rear end of the refrigerant introduction flow path 21*a* and there is a wide variation in the flow velocity of the refrigerant in the plurality of cooling flow paths 21*c*.

Next, the results of simulating the flow velocity of the refrigerant at the refrigerant introduction inlet 24 and the refrigerant discharge outlet 25 in each of the enclosure 21 of the parallel flow path type (FIG. 7(B)) and the enclosure 110 of the five-stage meandering flow path type (FIG. 9(B)) will be described.

It is assumed that pump performance is 30 L/min (0.3 MPa) and that the pump performance is constant. In addition, fins are arranged in the cooling flow paths 21*c* of the enclosure 21 and the flow path 111 of the enclosure 110.

Figure 11:
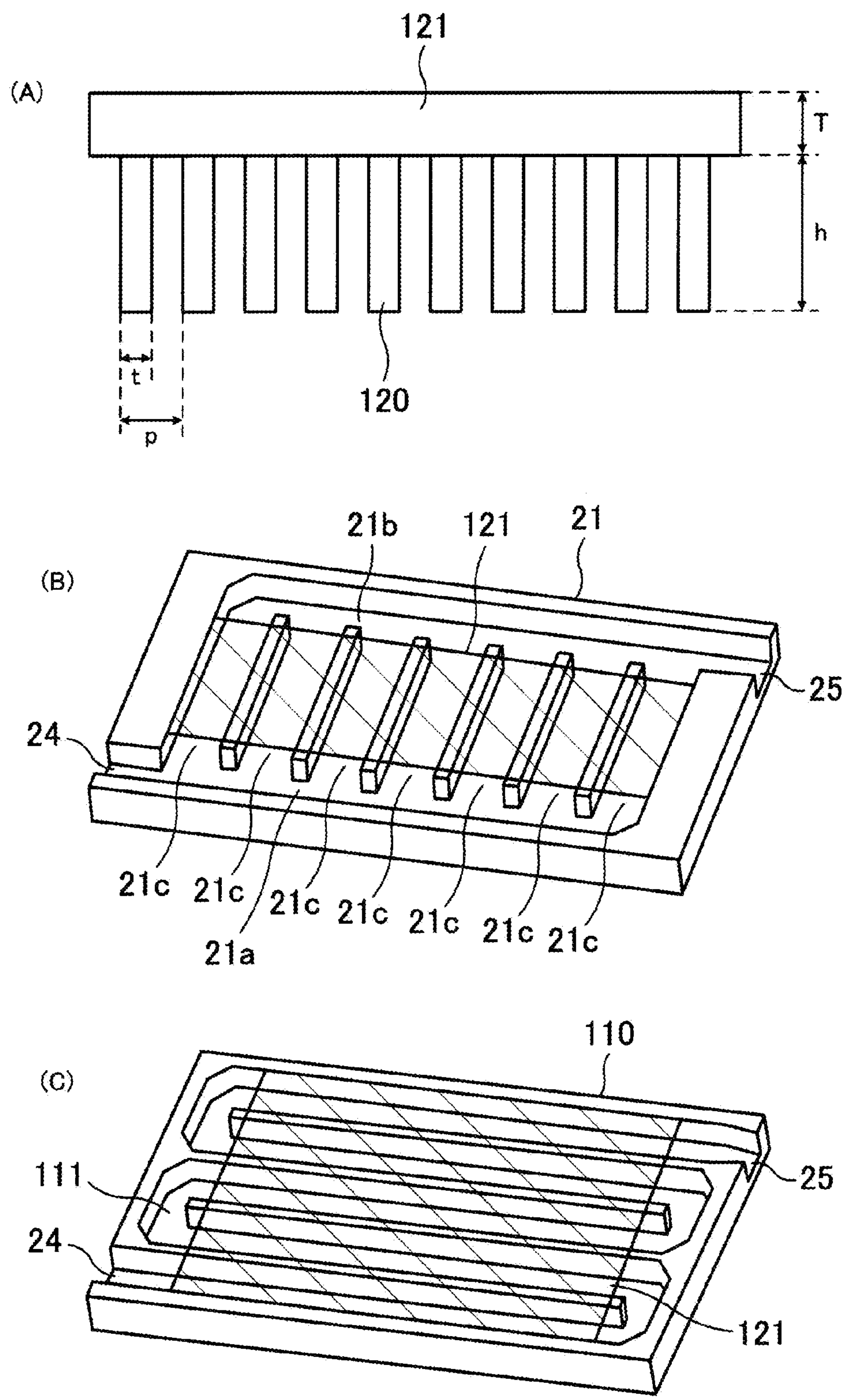
FIG. 11 is a view for describing a fin and an enclosure.

FIG. 11 is a view for describing a fin and an enclosure. FIG. 11(A) illustrates the shape of a fin, FIG. 11(B) is a schematic view of the relative positions of an enclosure of the parallel flow path type and fins, and FIG. 11(C) is a schematic view of the relative positions of an enclosure of the five-stage meandering flow path type and fins.

A plurality of plate-like fins 120 the size of which is indicated in FIG. 11(A) are arranged in the cooling flow paths 21*c* of the enclosure 21 and the flow path 111 of the enclosure 110 and simulations are performed. Each plate-like fin 120 is formed over a base member 121 the thickness T of which is 5 mm. The thickness t of each plate-like fin 120 is set to 0.5 mm, the height h of each plate-like fin 120 from the base member 121 is set to 10 mm, and a fin pitch p is set to 0.9 mm.

As illustrated in FIG. 11(B) or 11(C), the base member 121 over which the plurality of plate-like fins 120 each having the above structure are formed is placed with the surface over which the plurality of plate-like fins 120 are formed facing the enclosure 21 or 110. By doing so, the plurality of plate-like fins 120 are arranged in the cooling flow paths 21*c* or the flow path 111. In FIG. 11(B) or 11(C), the plurality of plate-like fins 120 are arranged only in the cooling flow paths 21*c* or the flow path 111 corresponding to an area in which the base member 121 is placed. In an actual semi-conductor module, by the way, a fin base 23 and circuit element sections 30 like those illustrated in the above FIGS. 1 and 2 are thermally bonded over a structure like that illustrated in FIG. 11(B) or 11(C).

Figure 12:
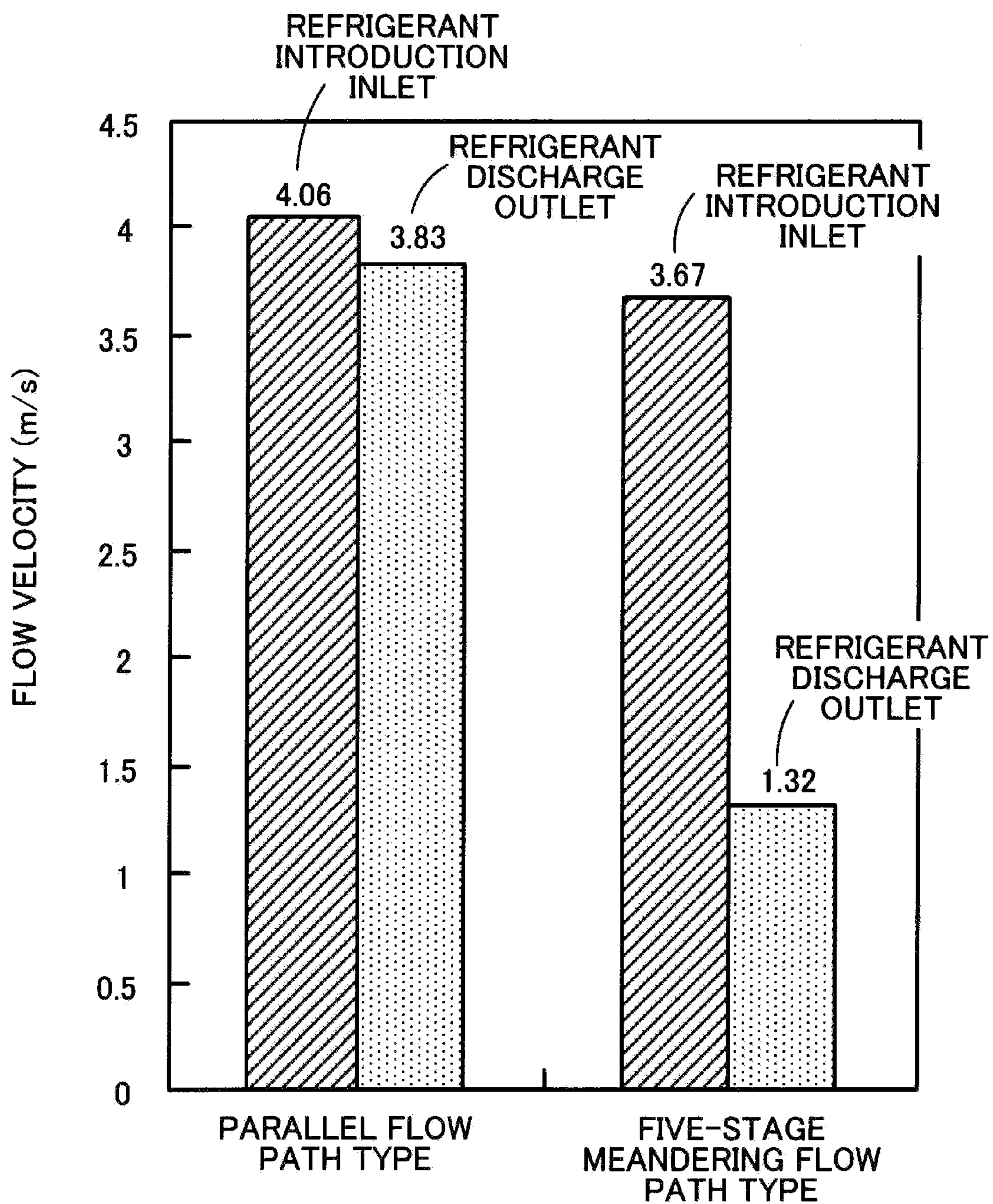
FIG. 12 illustrates an example of the result of simulating flow velocity.

FIG. 12 illustrates an example of the result of simulating the flow velocity.

In the case of the enclosure 21 of the parallel flow path type, as can be seen from FIG. 12, the flow velocity of the refrigerant is 4.06 m/s at the refrigerant introduction inlet 24 and is 3.83 m/s at the refrigerant discharge outlet 25. In the case of the enclosure 110 of the five-stage meandering flow path type, on the other hand, the flow velocity of the refrigerant is 3.67 m/s at the refrigerant introduction inlet 24 and is 1.32 m/s at the refrigerant discharge outlet 25.

That is to say, with the enclosure 21 of the parallel flow path type the flow velocity of the refrigerant at the refrigerant introduction inlet 24 decreases only by about 6 percent at the refrigerant discharge outlet 25. With the enclosure 110 of the five-stage meandering flow path type, on the other hand, the flow velocity of the refrigerant at the refrigerant introduction inlet 24 decreases by about 60 percent at the refrigerant discharge outlet 25.

With the enclosure 110 of the five-stage meandering flow path type, there are meandering portions (folded portions) in the flow path 111. The refrigerant introduced from the refrigerant introduction inlet 24 flows along the flow path 111 and is discharged from the refrigerant discharge outlet 25. Therefore, a comparatively great pressure loss occurs during this period. As a result, the flow velocity of the refrigerant discharged from the refrigerant discharge outlet 25 decreases rather significantly (corresponding to the curve Y2 of FIG. 8). The flow of the refrigerant stagnates in the flow path 111 of the enclosure 110. This may lead to the possibility that the effect of cooling a plurality of circuit element sections 30 and 30B to be arranged over the enclosure 110 diminishes or that cooling the plurality of circuit element sections 30 and 30B uniformly is difficult.

With the enclosure 21 of the parallel flow path type, on the other hand, the cooling flow paths 21*c* are formed in parallel with one another between the refrigerant introduction flow path 21*a* and the refrigerant discharge flow path 21*b*, so pressure loss which occurs between the refrigerant introduction inlet 24 and the refrigerant discharge outlet 25 is comparatively small. This means that the refrigerant introduced from the refrigerant introduction inlet 24 can be made to flow comparatively smooth to the refrigerant discharge outlet 25 (corresponding to the curve Y1 of FIG. 8). Accordingly, the plurality of circuit element sections 30 and 30B to be arranged over the enclosure 21 can be cooled effectively or the plurality of circuit element sections 30 and 30B can be cooled uniformly.

The result of simulating a change in the temperature of the circuit element sections 30 and 30B (change in the surface temperature of the semiconductor elements 32 or 33) caused by a change in pump performance will now be described.

Pump performance is 30 L/min, 20 L/min, or 10 L/min. In each case, a change in the temperature of the circuit element sections 30 and 30B is simulated. First, the semi-conductor module in which the twelve circuit element sections 30 and the two circuit element sections 30B are arranged over the cooling unit 20 including the enclosure 21 of the parallel flow path type in which the seven cooling flow paths 21*c* are formed is used (FIG. 7). The twelve circuit element sections 30 are arranged in two rows and six columns and the two circuit element sections 30B are arranged in two rows and one column. At the time of operation, each circuit element section 30B generates more heat than each circuit element section 30. In addition, a semiconductor module using the enclosure 100 or 110 illustrated in FIG. 9(A) or 9(B) in place of the enclosure 21 of the parallel flow path type in which the seven cooling flow paths 21*c* are formed is also used for comparison. In this case, the arrangement of circuit element sections 30 and 30B is the same.

Figure 13:
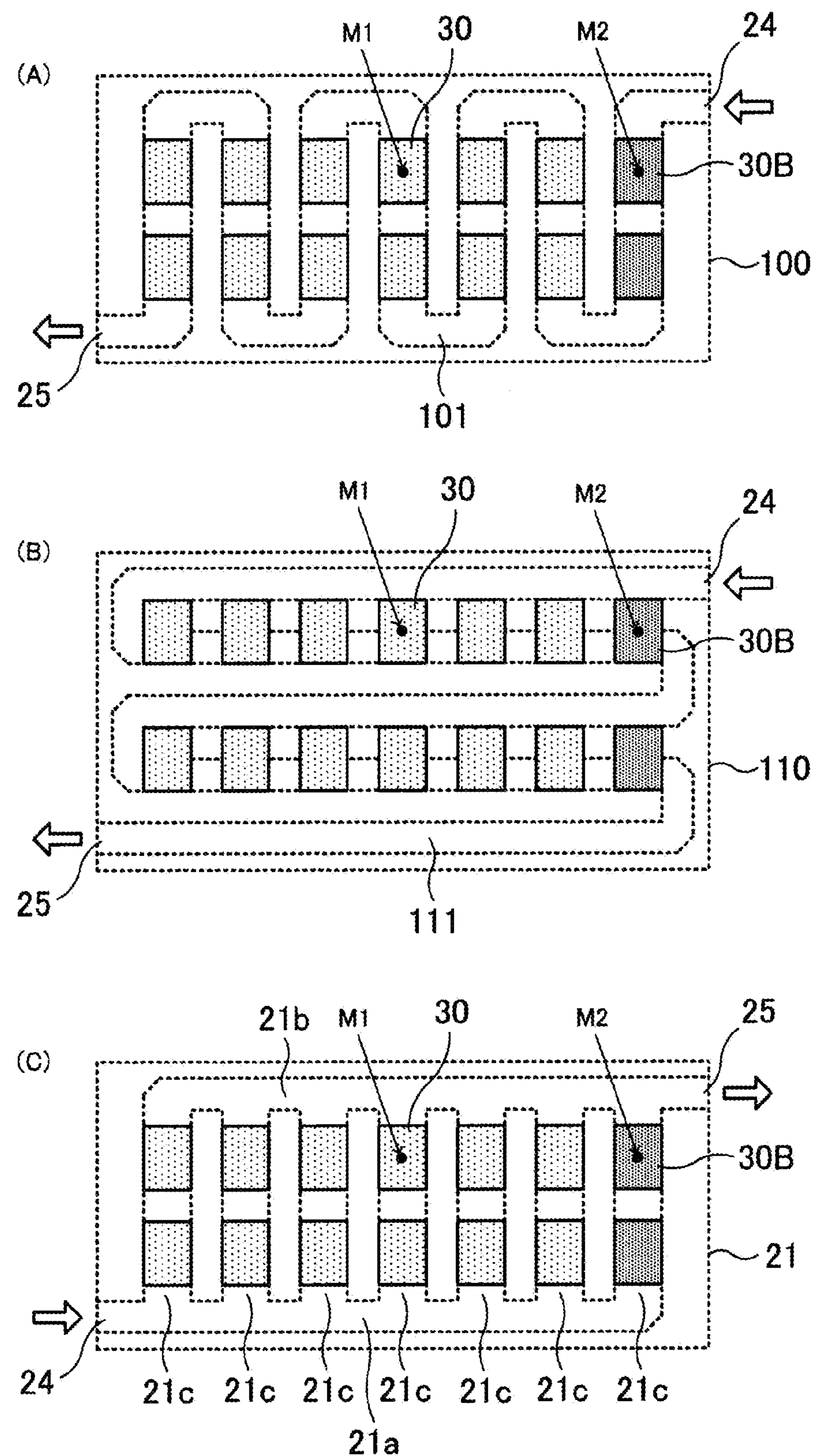
FIG. 13 illustrates the relative positions of an enclosure and circuit element sections.

FIG. 13 illustrates the relative positions of an enclosure and circuit element sections. FIG. 13(A) illustrates the relative positions of an enclosure of the seven-stage meandering flow path type and circuit element sections, FIG. 13(B) illustrates the relative positions of an enclosure of the five-stage meandering flow path type and circuit element sections, and FIG. 13(C) illustrates the relative positions of an enclosure of the parallel flow path type and circuit element sections. In FIG. 13, points at which temperature is measured are also indicated.

The circuit element sections 30 and 30B are arranged over the enclosures 100, 110, and 21 of the cooling units in accordance with their relative positions illustrated in FIGS. 13(A), 13(B), and 13(C) respectively. For convenience' sake the enclosures 100, 110, and 21 are indicated by dotted lines in FIG. 13.

With the enclosure 100 of the seven-stage meandering flow path type illustrated in FIG. 13(A), the circuit element sections 30B which generate much heat are arranged near the edge on the side on which the refrigerant introduction inlet 24 is formed. With the enclosure 110 of the five-stage meandering flow path type illustrated in FIG. 13(B), the circuit element sections 30B which generate much heat are arranged near the edge on the side on which the refrigerant introduction inlet 24 is formed. This is the same with FIG. 13(A).

With the enclosure 21 of the parallel flow path type illustrated in FIG. 13(C), on the other hand, the circuit element sections 30B which generate much heat are arranged over the enclosure 21 and near the edge on the side on which the refrigerant discharge outlet 25 is formed. That is to say, on the basis of the result of simulating the distribution of the flow velocity illustrated in FIG. 10, the circuit element sections 30B which generate much heat are arranged at positions corresponding to one (cooling flow path 21*c* which communicates with the rear end of the refrigerant introduction flow path 21*a*) of the plurality of cooling flow paths 21*c* of the enclosure 21 in which the flow velocity is high.

The relative positions of the circuit element sections 30 and 30B and the enclosure 100, the circuit element sections 30 and 30B and the enclosure 110, and the circuit element sections 30 and 30B and the enclosure 21 are illustrated in FIGS. 13(A), 13(B), and 13(C) respectively. Points at which the temperature of the circuit element sections 30 and 30B is measured are the position M1 of the central circuit element section 30 arranged in the first row (upper row) and the fourth column from the left and the position M2 of the rightmost circuit element section 30B arranged in the first row and the seventh column from the left.

Figure 14:
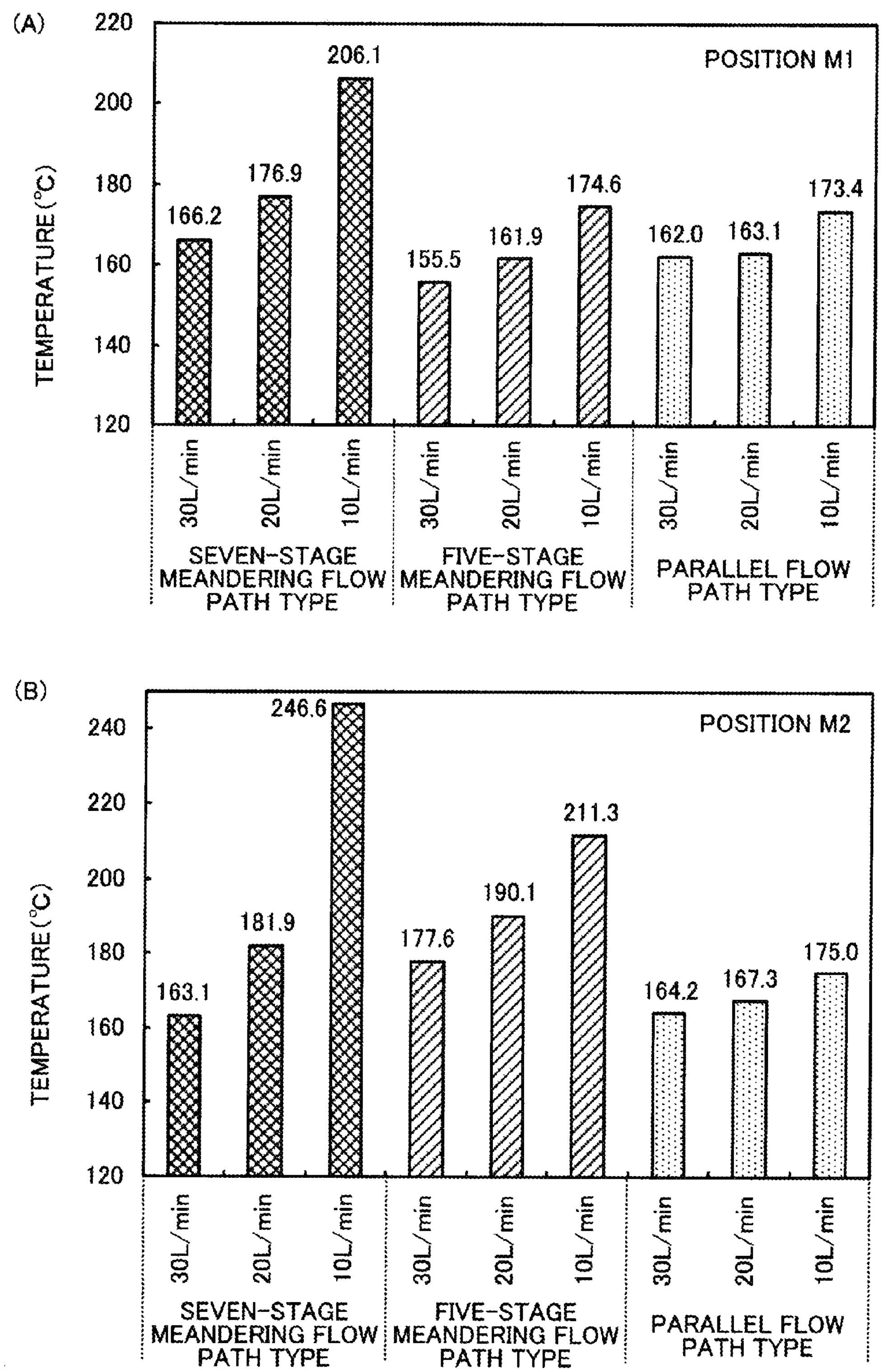
FIG. 14 illustrates an example of the result of simulating temperature.

FIG. 14 illustrates an example of the result of simulating temperature. FIG. 14(A) illustrates the result of simulating temperature at the position M1 and FIG. 14(B) illustrates the result of simulating temperature at the position M2.

As illustrated in FIG. 14(A), if the enclosure 100 of the seven-stage meandering flow path type is used, temperature at the position M1 of the above circuit element section 30 rises from 166.2 degree C. through 176.9 degree C. to 206.1 degree C. as the pump performance falls off from 30 L/min through 20 L/min to 10 L/min. Similarly, if the enclosure 110 of the five-stage meandering flow path type is used, temperature at the position M1 of the above circuit element section 30 rises from 155.5 degree C. through 161.9 degree C. to 174.6 degree C. If the enclosure 21 of the parallel flow path type is used, temperature at the position M1 of the above circuit element section 30 rises from 162.0 degree C. through 163.1 degree C. to 173.4 degree C.

As illustrated in FIG. 14(B), if the enclosure 100 of the seven-stage meandering flow path type is used, temperature at the position M2 of the above circuit element section 30B rises from 163.1 degree C. through 181.9 degree C. to 246.6 degree C. as the pump performance falls off from 30 L/min through 20 L/min to 10 L/min. Similarly, if the enclosure 110 of the five-stage meandering flow path type is used, temperature at the position M2 of the above circuit element section 30B rises from 177.6 degree C. through 190.1 degree C. to 211.3 degree C. If the enclosure 21 of the parallel flow path type is used, temperature at the position M2 of the above circuit element section 30B rises from 164.2 degree C. through 167.3 degree C. to 175.0 degree C.

Compared with the case where the enclosure 100 of the seven-stage meandering flow path type or the enclosure 110 of the five-stage meandering flow path type is used, as can be seen from the results illustrated in FIGS. 14(A) and 14(B), a rise in the temperature caused by deterioration in the pump performance can be made comparatively small in the case where the enclosure 21 of the parallel flow path type is used. That is to say, it may safely be said that with the enclosure 21 of the parallel flow path type performance on cooling the circuit element sections 30 and 30B is not influenced easily by the pump performance. The reason for this is that, as stated above, the enclosure 21 has a structure in which refrigerant pressure loss is comparatively small. With the enclosure 100 of the seven-stage meandering flow path type or the enclosure 110 of the five-stage meandering flow path type, on the other hand, pressure loss is comparatively heavy because of the presence of the meandering portions, so performance on cooling the circuit element sections 30 and 30B is influenced easily by the pump performance. As a result, deterioration in the pump performance easily causes a decrease in refrigerant flow velocity and the efficiency of cooling the circuit element sections 30 and 30B falls easily.

In addition, as can be seen from the results illustrated in FIGS. 14(A) and 14(B), the circuit element sections 30 and 30B which differ in amount of heat generated can be cooled to approximately the same temperature regardless of the pump performance by the use of the enclosure 21 of the parallel flow path type. Therefore, the plurality of circuit element sections 30 and 30B included in the semiconductor module 10B can be cooled uniformly.

A result obtained by examining the relationship between refrigerant flow velocity and refrigerant pressure loss (difference between refrigerant pressure at the refrigerant introduction inlet 24 and the refrigerant discharge outlet 25) in the enclosure 21 of the parallel flow path type (FIG. 7(B)) and the enclosure 100 of the seven-stage meandering flow path type (FIG. 9(A)) in a simulation will now be described.

Figure 15:
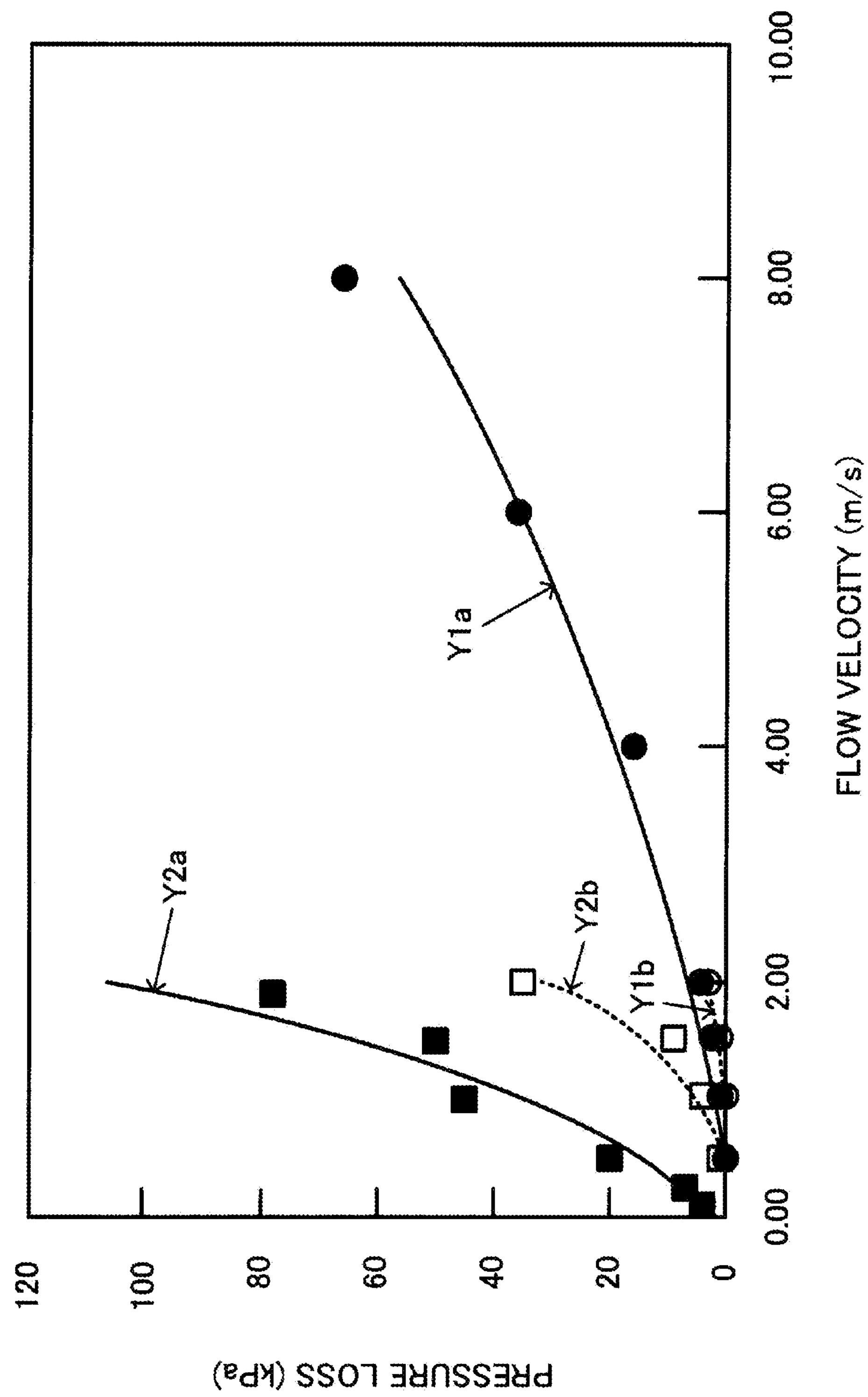
FIG. 15 illustrates an example of the result of simulating the relationship between refrigerant flow velocity and refrigerant pressure loss.

FIG. 15 illustrates an example of the result of simulating the relationship between refrigerant flow velocity and refrigerant pressure loss.

Both in the case of the enclosure 21 of the parallel flow path type (curve Y1*a*) and in the case of the enclosure 100 of the seven-stage meandering flow path type (curve Y2*a*), as can be seen from FIG. 15, there is a tendency for pressure loss to increase with an increase in flow velocity. Compared with the case of the enclosure 100 of the seven-stage meandering flow path type (curve Y2*a*), however, the degree of an increase in pressure loss in relation to an increase in flow velocity is small in the case of the enclosure 21 of the parallel flow path type (curve Y1*a*). The curves Y1*a* and Y2*a* indicate the results of simulations performed in the case of arranging determined fins in the flow paths 21*c* of the enclosure 21 and the flow path 101 of the enclosure 100 respectively. In FIG. 15, the results of simulations performed in the case of not arranging the determined fins in the flow paths 21*c* of the enclosure 21 or the flow path 101 of the enclosure 100 are also indicated as curves Y1*b* and Y2*b* respectively.

As can be seen from the results indicated in FIG. 15, even if the refrigerant flows at the same flow velocity, pressure loss is heavy in the case of using the enclosure 100 of the seven-stage meandering flow path type (curves Y2*a* and Y2*b*), compared with the case where the enclosure 21 of the parallel flow path type is used (curves Y1*a* and Y2*a*). That is to say, in order to ensure a certain flow velocity or higher necessary for cooling even in the case of the occurrence of pressure loss, a high-performance pump should be used in the case of using the enclosure 100 of the seven-stage meandering flow path type for circulating the refrigerant, compared with the case where the enclosure 21 of the parallel flow path type is used.

In addition, as can be seen from the results indicated in FIG. 15, if pressure loss is constant, then the refrigerant can be made to flow at a high flow velocity in the case of using the enclosure 21 of the parallel flow path type (curves Y1*a* and Y2*a*), compared with the case where the enclosure 100 of the seven-stage meandering flow path type is used (curves Y2*a* and Y2*b*). That is to say, if pumps used for circulating the refrigerant are equal in performance, then the refrigerant can be made to flow at a high flow velocity in the case of using the enclosure 21 of the parallel flow path type, compared with the case where the enclosure 100 of the seven-stage meandering flow path type is used. According to the results indicated in FIG. 15, for example, the refrigerant can be made to flow at a flow velocity of 4 m/s or higher in the enclosure 21 of the parallel flow path type if a pump which can accommodate a pressure loss of 20 kPa is used. However, it is difficult to make the refrigerant flow at a flow velocity of 1 m/s in the enclosure 100 of the seven-stage meandering flow path type.

Figure 16:
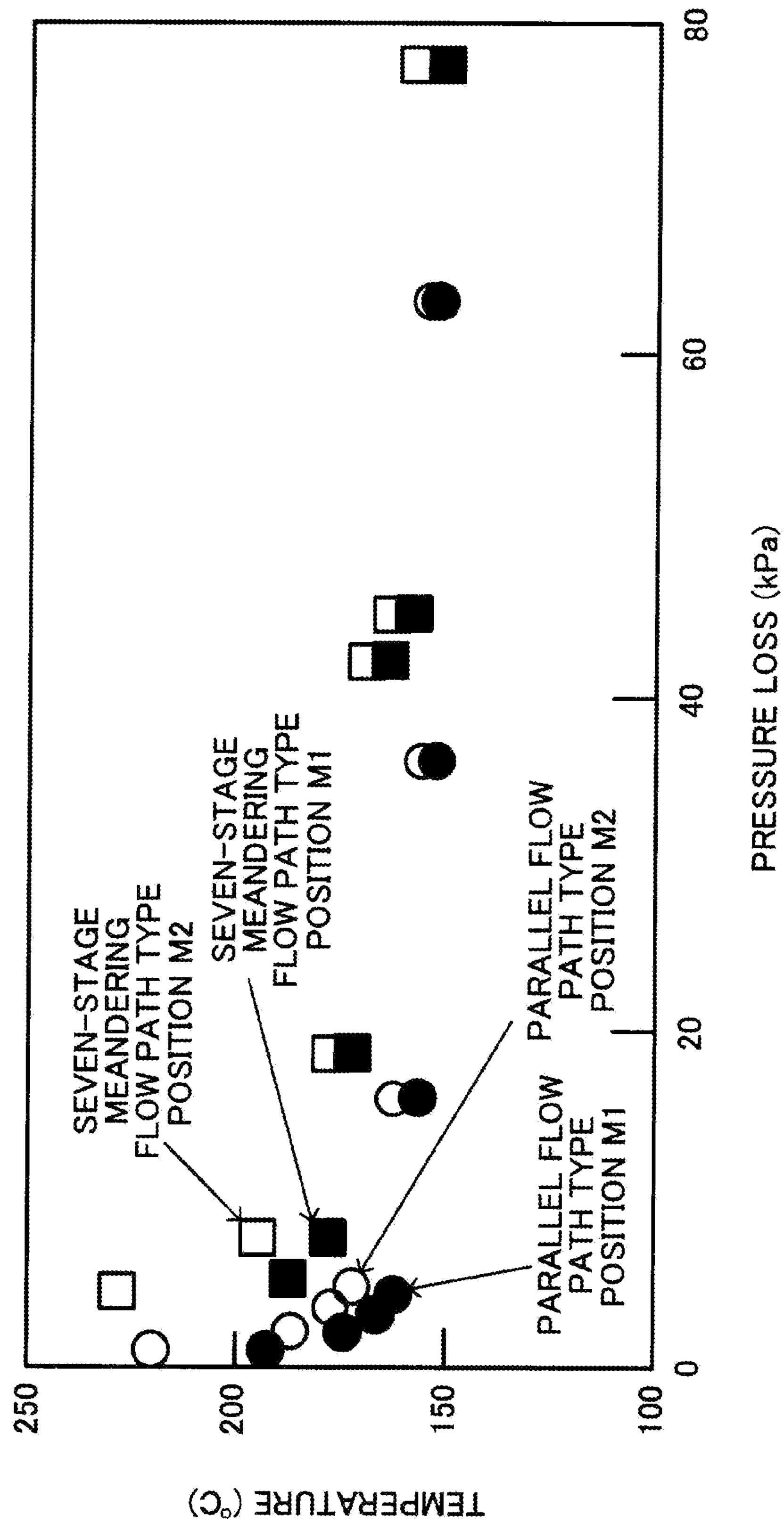
FIG. 16 illustrates an example of the result of simulating the relationship between refrigerant pressure loss and temperature.

FIG. 16 illustrates an example of the result of simulating the relationship between refrigerant pressure loss and temperature.

FIG. 16 illustrates the result of simulating the relationship between refrigerant pressure loss and temperature at the positions M1 and M2 in the case of arranging the circuit element sections 30 and 30B over the enclosure 21 of the parallel flow path type and the enclosure 100 of the seven-stage meandering flow path type in the ways illustrated in FIGS. 13(C) and 13(A) respectively.

Both in the case of using the enclosure 21 of the parallel flow path type and in the case of using the enclosure 100 of the seven-stage meandering flow path type, as can be seen from the results indicated in FIG. 16, temperature at the positions M1 and M2 falls with an increase in pressure loss. After the pressure loss reaches a certain value, the temperature at the positions M1 and M2 becomes approximately constant in both cases. Pressure loss at which the temperature at the positions M1 and M2 becomes approximately constant is small in the case of using the enclosure 21 of the parallel flow path type, compared with the case where the enclosure 100 of the seven-stage meandering flow path type is used. That is to say, pressure loss which occurs at the time of lowering the temperature of the circuit element sections 30 and 30B to a constant level is small in the case of using the enclosure 21 of the parallel flow path type, compared with the case where the enclosure 100 of the seven-stage meandering flow path type is used.

In other words, pressure loss is heavy in the case of using the enclosure 100 of the seven-stage meandering flow path type, compared with the case where the enclosure 21 of the parallel flow path type is used. Therefore, in order to lower the temperature of the circuit element sections 30 and 30B to the constant level, it is necessary to use a higher-performance pump for circulating the refrigerant. With the enclosure 21 of the parallel flow path type, it is possible to cool the circuit element sections 30 and 30B without using a pump which causes a significant increase in the cost.

As has been described, with the above cooling unit 20 the enclosure 21 in which the plurality of cooling flow paths 21*c* are formed in parallel with one another between the refrigerant introduction flow path 21*a* and the refrigerant discharge flow path 21*b* is used. By doing so, pressure loss is made small and the refrigerant is made to flow at a certain flow velocity or higher in the cooling unit 20. In addition, the fins 22 thermally connected to the circuit element sections 30 and 30B arranged over the cooling unit 20 are arranged in the plurality of cooling flow paths 21*c* along which the refrigerant flows. By using this cooling unit 20, the circuit element sections 30 and 30B arranged thereover can be cooled effectively.

Furthermore, with the above cooling unit 20 the flow velocity of the refrigerant which flows along one of the plurality of cooling flow paths 21*c* which communicates with the rear end of the refrigerant introduction flow path 21*a* is high because of the structure of the enclosure 21. Accordingly, if, for example, the circuit element sections 30 and the circuit element sections 30B each of which generates more heat than each circuit element section 30 are arranged, the circuit element sections 30B are arranged over the cooling flow path 21*c* in which the flow velocity of the refrigerant is high. As a result, both of the circuit element sections 30 and 30B can be cooled effectively and the circuit element sections 30 and 30B arranged over the cooling unit 20 can be cooled uniformly to the approximately the same temperature.

In addition to the above structures, the enclosure 21 of the cooling unit 20 may have the following structures.

Figure 17:
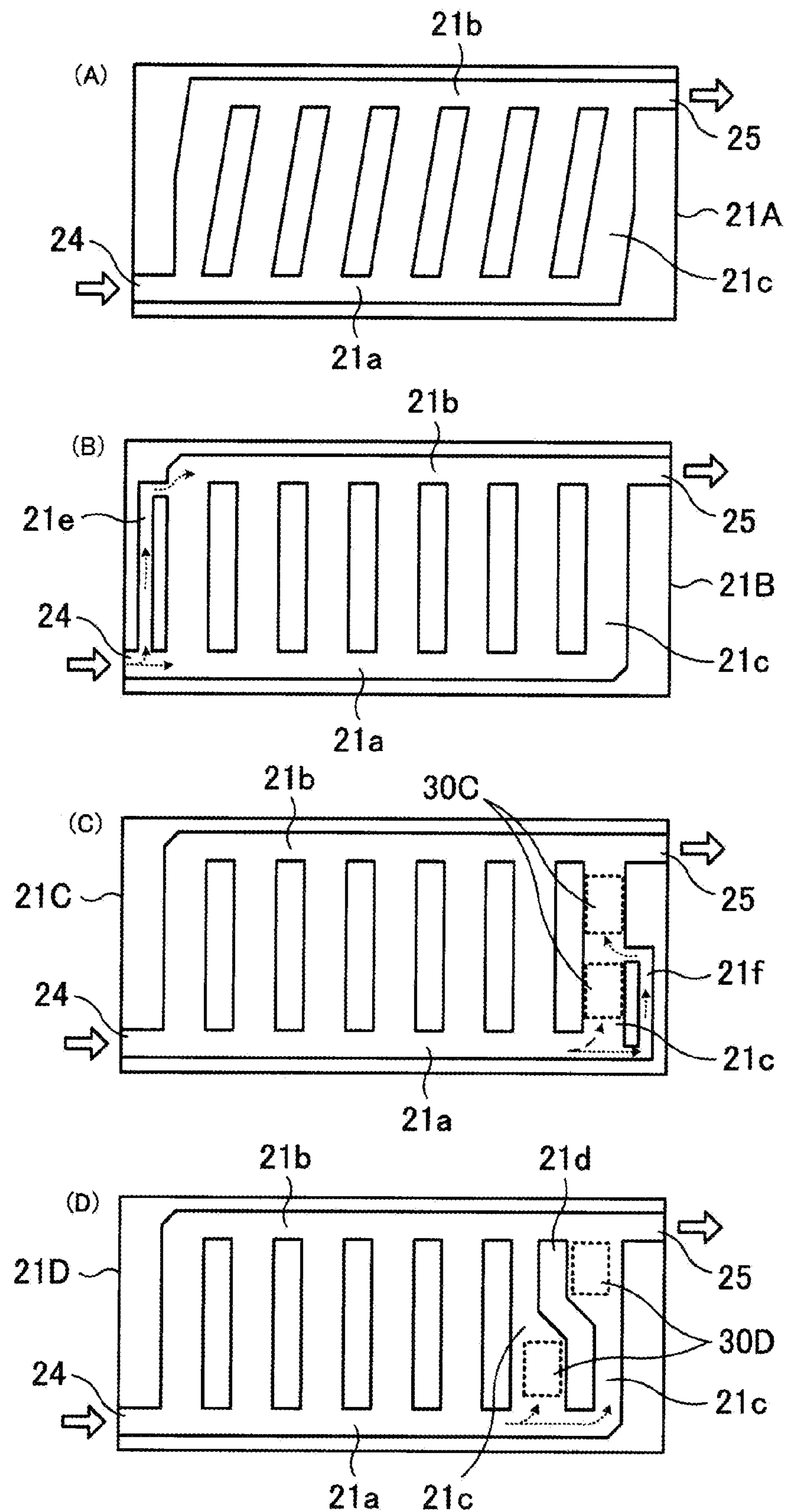
FIG. 17 illustrates first through fourth modifications of the enclosure.

FIG. 17 illustrates first through fourth modifications of the enclosure. FIG. 17(A) is a schematic plan view of a first modification of the enclosure, FIG. 17(B) is a schematic plan view of a second modification of the enclosure, FIG. 17(C) is a schematic plan view of a third modification of the enclosure, and FIG. 17(D) is a schematic plan view of a fourth modification of the enclosure.

An enclosure 21A illustrated in FIG. 17(A) differs from the above enclosure 21 in that a plurality of cooling flow paths 21*c* which communicate with a refrigerant introduction flow path 21*a* extending from a refrigerant introduction inlet 24 and a refrigerant discharge flow path 21*b* extending to a refrigerant discharge outlet 25 are formed obliquely. That is to say, the plurality of cooling flow paths 21*c* are formed so that the direction in which the refrigerant introduction flow path 21*a* and the refrigerant discharge flow path 21*b* extend and the direction in which the plurality of cooling flow paths 21*c* extend will cross obliquely. By forming the plurality of cooling flow paths 21*c* in this way, the flow of the refrigerant from the refrigerant introduction flow path 21*a* into the plurality of cooling flow paths 21*c* and the flow of the refrigerant from the plurality of cooling flow paths 21*c* into the refrigerant discharge flow path 21*b* become smooth and the flow velocity of the refrigerant which flows along the plurality of cooling flow paths 21*c* can be increased.

An enclosure 21B illustrated in FIG. 17(B) differs from the above enclosure 21 in that a bypass flow path 21*e* extending from the vicinity of a refrigerant introduction inlet 24 to a cooling flow path 21*c* nearest the refrigerant introduction inlet 24 is formed in the external wall. By making the refrigerant flow along the bypass flow path 21*e* (indicated by the dotted-line arrow of FIG. 17(B)), the directivity of a flow of the refrigerant which flows along a refrigerant discharge flow path 21*b* can be increased. As a result, the flow velocity of the refrigerant which flows along a plurality of cooling flow paths 21*c* can be made uniform.

An enclosure 21C illustrated in FIG. 17(C) differs from the above enclosure 21 in that a bypass flow path 21*f* is formed in the external wall on the rear end side of a refrigerant introduction flow path 21*a*. For example, if two circuit element sections 30C are put side by side over a cooling flow path 21*c* as indicated by the dotted lines of FIG. 17(C), the two circuit element sections 30C can be cooled effectively by forming the bypass flow path 21*f*. That is to say, one circuit element section 30C nearer the refrigerant introduction flow path 21*a* can be cooled effectively by the refrigerant which flows into the cooling flow path 21*c* from the refrigerant introduction flow path 21*a* (indicated by the chain-line arrow of FIG. 17(C)). The other circuit element section 30C nearer a refrigerant discharge flow path 21*b* can be cooled effectively by the refrigerant which flows from the refrigerant introduction flow path 21*a* through the bypass flow path 21*f* into the cooling flow path 21*c* (indicated by the dotted-line arrows of FIG. 17(C)). The enclosure 21C may be combined with the bypass flow path 21*e* illustrated in FIG. 17(B).

An enclosure 21D illustrated in FIG. 17(D) differs from the above enclosure 21 in that a partition wall 21*d* of a cooling flow path 21*c* which is on the rear end side of a refrigerant introduction flow path 21*a* has the shape of approximately the letter "S." If the above partition wall 21*d* is formed, two circuit element sections 30D, for example, are arranged over cooling flow paths 21*c* as indicated by the dotted lines of FIG. 17(D). In this case, one circuit element section 30D is arranged on one side of the partition wall 21*d* and the other circuit element section 30D is arranged on the other side of the partition wall 21*d*. By arranging the two circuit element sections 30D over the different cooling flow paths 21*c* in this way, the two circuit element sections 30D can be cooled effectively. The enclosure 21D may be combined with the bypass flow path 21*e* illustrated in FIG. 17(B).

Figure 18:
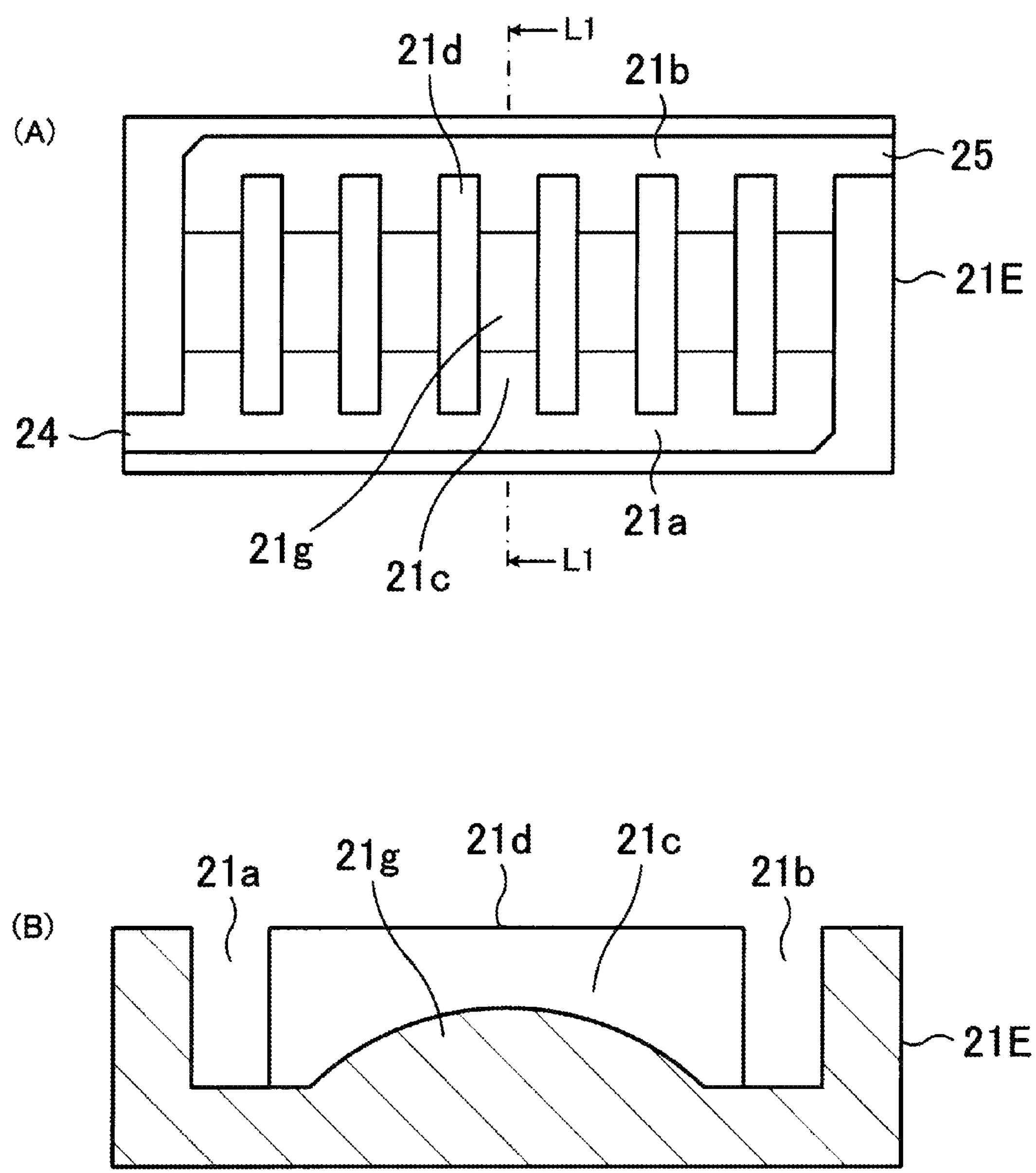
FIG. 18 illustrates a fifth modification of the enclosure.

FIG. 18 illustrates a fifth modification of the enclosure. FIG. 18(A) is a schematic plan view of a fifth modification of the enclosure and FIG. 18(B) is a schematic sectional view taken along the dot-dash line of FIG. 18(A).

An enclosure 21E illustrated in FIGS. 18(A) and 18(B) differs from the above enclosure 21 in that a prominence 21*g* is formed by making part of the bottom of each cooling flow path 21*c* upheave. By forming the prominence 21*g* in each cooling flow path 21*c* in this way, the cross-sectional area of each cooling flow path 21*c* becomes smaller at the prominence 21*g*. As a result, the flow velocity of the refrigerant which flows along each cooling flow path 21*c* can be increased.

The prominence 21*g* can be applied to any of the above enclosures 21 and 21A through 21D. In this example, the cross-sectional area of a flow path is decreased by forming the prominence 21*g* at the bottom of each cooling flow path 21*c*. However, the cross-sectional area of each cooling flow path 21*c* can also be decreased by making part of partition walls 21*d* on both sides of each cooling flow path 21*c* thicker.

Furthermore, enclosures having the following structures may be used in the cooling unit 20 in order to efficiently guide the refrigerant into each cooling flow path 21*c*.

Figure 19:
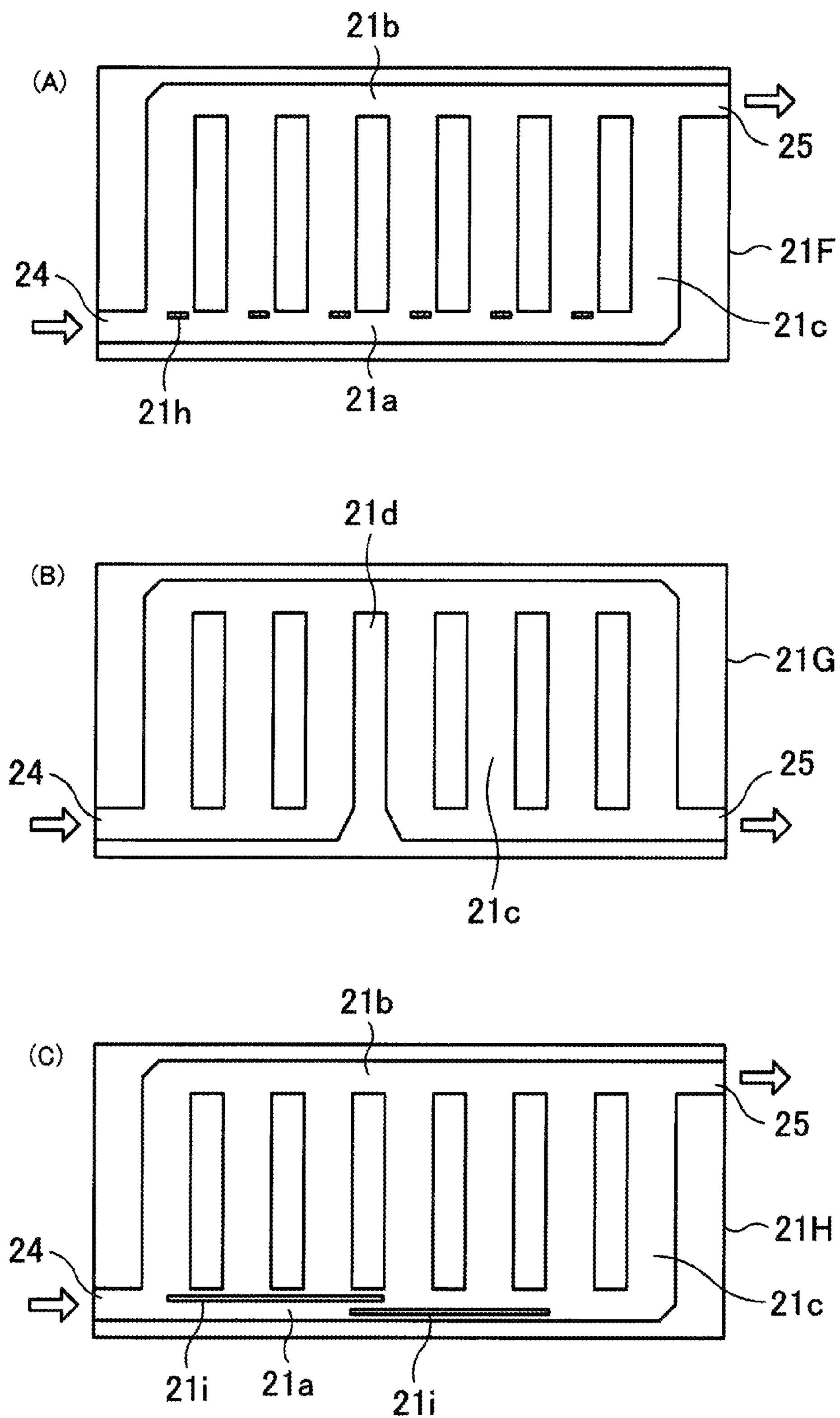
FIG. 19 illustrates sixth through eighth modifications of the enclosure.

FIG. 19 illustrates sixth through eighth modifications of the enclosure. FIG. 19(A) is a schematic plan view of a sixth modification of the enclosure, FIG. 19(B) is a schematic plan view of a seventh modification of the enclosure, and FIG. 19(C) is a schematic plan view of an eighth modification of the enclosure.

An enclosure 21F illustrated in FIG. 19(A) differs from the above enclosure 21 in that plate-like guides 21*h* are arranged on a refrigerant introduction flow path 21*a* near each cooling flow path 21*c*. The refrigerant which flows along the refrigerant introduction flow path 21*a* easily branches off by the guides 21*h*. That is to say, part of the refrigerant which flows along the refrigerant introduction flow path 21*a* flows into each cooling flow path 21*c* and the rest continues to flow along the refrigerant introduction flow path 21*a*. The guides 21*h* may be formed at the bottom of the enclosure 21F or over a fin base 23 placed over the enclosure 21F. In addition, the guides 21*h* may be formed both at the bottom of the enclosure 21F and over the fin base 23 at need with resistance and the like taken into consideration so that the edges of the guides 21*h* formed at the bottom of the enclosure 21F will be apart from and opposite to the edges of the guides 21*h* formed over the fin base 23.

An enclosure 21G illustrated in FIG. 19(B) differs from the above enclosure 21 in that a central partition wall 21*d* extends to one external wall portion. As a result, the refrigerant can be guided more uniformly into each cooling flow path 21*c*.

An enclosure 21H illustrated in FIG. 19(C) differs from the above enclosure 21 in that plate-like guides 21*i* are arranged over the vicinities of a plurality of cooling flow paths 21*c* on a refrigerant introduction flow path 21*a*. In this example, two guides 21*i* are arranged and one guide 21*i* is shifted slightly from the other guide 21*i* in the direction perpendicular to the direction in which the refrigerant introduction flow path 21*a* extends. The refrigerant which flows along the refrigerant introduction flow path 21*a* also branches off easily by the guides 21*i*. That is to say, part of the refrigerant which flows along the refrigerant introduction flow path 21*a* flows into each cooling flow path 21*c* and the rest continues to flow along the refrigerant introduction flow path 21*a*. This is the same with the above FIG. 19(A).

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

REFERENCE SIGNS LIST

10, 10A, 10B Semiconductor Module
20 Cooling Unit
21, 21A through 21H, 100, 110 Enclosure
21*a* Refrigerant Introduction Flow Path
21*b* Refrigerant Discharge Flow Path
21*c* Cooling Flow Path
21*d* Partition Wall
21*e*, 21*f* Bypass Flow Path
21*g* Prominence
21*h*, 21*i* Guide
22 Fin
22*a* Pin-like Fin
22*b*, 120 Flat-plate-like Fin
22*c* Staggered Fin
22*d* Corrugated-plate-like Fin
22*e* Corrugated Fin
23 Fin Base
24 Refrigerant Introduction Inlet
25 Refrigerant Discharge Outlet
26, 121 Base Member
30, 30B, 30C, 30D Circuit Element Section
31 Board
31*a* Insulating Board
31*b*, 31*c* Conductor Pattern
32, 33 Semiconductor Element
34, 35 Bonding Layer
40 Inverter Circuit
41 Three-phase AC Motor
101, 111 Flow Path
C Clearance
T, t Thickness
h, H Height
p, P Pitch
M1, M2 Position
Q1, Q2 Flow Velocity
X, Y1, Y2, Y1*a*, Y2*a*, Y1*b*, Y2*b*, Z Curve

The invention claimed is:

1. A semiconductor module comprising:
a cooling unit including:
a first flow path which extends from a refrigerant introduction inlet, a second flow path which is arranged in parallel with the first flow path and which extends to a refrigerant discharge outlet, a plurality of third flow paths which communicate with the first flow path and the second flow path, a heat sink which is arranged in the plurality of third flow paths, and one or more guides for guiding a refrigerant in the direction of extending the first flow path in the first flow path, wherein the one or more guides are separated from an edge of the plurality of third flow paths; and
at least one semiconductor element which is thermally connected to the cooling unit.

2. The semiconductor module according to claim 1, wherein the at least one semiconductor element is arranged over at least one of the plurality of third flow paths.

3. The semiconductor module according to claim 1, wherein the plurality of third flow paths are arranged in parallel with one another.

4. The semiconductor module according to claim 1, wherein the plurality of third flow paths are arranged so that the plurality of third flow paths are approximately perpendicular to the first flow path and the second flow path.

5. The semiconductor module according to claim 1, wherein the plurality of third flow paths are arranged so that the plurality of third flow paths cross the first flow path and the second flow path obliquely.

6. The semiconductor module according to claim 1, wherein cross-sectional area of at least one of the plurality of third flow paths is partially small.

7. A cooling unit comprising:
a first flow path which extends from a refrigerant introduction inlet;
a second flow path which is arranged in parallel with the first flow path and which extends to a refrigerant discharge outlet;
a plurality of third flow paths which communicate with the first flow path and the second flow path;
a heat sink which is arranged in the plurality of third flow paths and
one or more guides for guiding a refrigerant in the direction of extending the first flow path in the first flow path, wherein the one or more guides are separated from an edge of the plurality of third flow paths.

8. The semiconductor module according to claim 1, wherein the cooling unit including:
a fin base having the heat sink;
an enclosure having partition wall which form the plurality of the third flow paths;
wherein the guide is formed at the bottom of the enclosure.

9. The semiconductor module according to claim 1, wherein a fin base having the heat sink;
an enclosure having partition wall which form the plurality of the third flow paths;
wherein the guide is formed at over a fin base placed over the enclosure.

10. The semiconductor module according to claim 1, wherein a fin base having the heat sink;
an enclosure having partition wall which form the plurality of the third flow paths;
wherein the guide is formed both at the bottom of the enclosure and over the fin base.

11. The semiconductor module according to claim 1, wherein:
one semiconductor element, and a second semiconductor element which generates less heat than the one semiconductor element, are include as the at least one semiconductor element; and
the one semiconductor element is arranged on a rear end side of the first flow path over the cooling unit and the second semiconductor element is arranged on a front end side of the first flow path over the cooling unit.

12. The cooling unit according to claim 7, wherein
the guides are a plurality of plate-like guide and arranged to be shifted from each other and over the inlets of at least one of the plurality of third flow paths in the first flow path.

* * * * *